United States Patent
Lundberg

(10) Patent No.: US 9,007,122 B2
(45) Date of Patent: Apr. 14, 2015

(54) DIGITAL POWER GATING WITH STATE RETENTION

(71) Applicant: Via Technologies, Inc., New Taipei (TW)

(72) Inventor: James R. Lundberg, Austin, TX (US)

(73) Assignee: Via Technologies, Inc., New Taipei (TW)

( * ) Notice: Subject to any disclaimer, the term of this patent is extended or adjusted under 35 U.S.C. 154(b) by 0 days.

(21) Appl. No.: 14/202,275

(22) Filed: Mar. 10, 2014

(65) Prior Publication Data

US 2014/0361819 A1    Dec. 11, 2014

Related U.S. Application Data

(60) Provisional application No. 61/831,544, filed on Jun. 5, 2013, provisional application No. 61/930,356, filed on Jan. 22, 2014.

(51) Int. Cl.
  *G05F 1/10* (2006.01)
  *H03K 17/22* (2006.01)
  *G06F 1/32* (2006.01)
  (Continued)

(52) U.S. Cl.
  CPC .............. *H03K 17/22* (2013.01); *G06F 1/3234* (2013.01); *H03K 19/0008* (2013.01); *H03K 17/16* (2013.01); *H03K 2217/0036* (2013.01); *H03K 19/0016* (2013.01)

(58) Field of Classification Search
  USPC ......... 327/365, 392–394, 396, 398, 399, 401, 327/530, 544
  See application file for complete search history.

(56) References Cited

U.S. PATENT DOCUMENTS 6,512,394 B1 *   1/2003   Parris .............................. 326/34
6,872,991 B1 *   3/2005   Ngo et al. ...................... 257/207
6,977,519 B2 *  12/2005   Bhavnagarwala et al. ..... 326/34

(Continued)

FOREIGN PATENT DOCUMENTS

WO    WO2009144661    12/2009

OTHER PUBLICATIONS

Tokunaga, Carlos et al. "A Graphics Execution Core in 22nm CMOS Featuring Adaptive Clocking, Selective Boosting and State-Retentive Sleep." International Solid-State Circuits Conference. 2014 IEEE pp. 1-21.

(Continued)

*Primary Examiner* — William Hernandez
(74) *Attorney, Agent, or Firm* — Gary Stanford; James W. Huffman

(57) ABSTRACT

A digital power gating system for performing power gating to reduce a voltage of a gated supply bus to a state retention voltage level that reduces leakage current while retaining a digital state of a functional circuit. The power gating system includes gating devices and a power gating control system. Each gating device has current terminals coupled between a global supply bus and the gated supply bus, and a control terminal controlled by a bit of a digital control value. The power gating control system successively adjusts the digital control value to reduce a voltage of the gated supply bus to the state retention voltage level. Adjustment gain and/or adjustment periods may be changed, such as when the digital control value reaches certain values or when the gated supply reaches certain voltage levels. Various parameters are programmable to adjust for particular configurations or to achieve desired operation.

43 Claims, 16 Drawing Sheets

(51) Int. Cl.
*H03K 19/00* (2006.01)
*H03K 17/16* (2006.01)

(56) References Cited

U.S. PATENT DOCUMENTS

| | | | | |
|---|---|---|---|---|
| 7,126,370 | B2 * | 10/2006 | Bhattacharya | 326/33 |
| 7,190,187 | B2 * | 3/2007 | Hua et al. | 326/27 |
| 7,420,388 | B2 * | 9/2008 | Bhattacharya | 326/33 |
| 7,436,205 | B2 * | 10/2008 | Tada | 326/33 |
| 7,479,801 | B2 * | 1/2009 | Bhattacharya | 326/33 |
| 7,605,636 | B2 * | 10/2009 | Rhee | 327/534 |
| 7,612,604 | B2 | 11/2009 | Miyazaki et al. | |
| 7,643,368 | B2 * | 1/2010 | Choi et al. | 365/227 |
| 7,659,773 | B2 * | 2/2010 | Choi et al. | 327/544 |
| 7,667,484 | B2 * | 2/2010 | Tada | 326/33 |
| 7,716,609 | B1 | 5/2010 | Taheri | |
| 7,911,855 | B2 * | 3/2011 | Tada | 365/189.09 |
| 8,120,410 | B2 | 2/2012 | Meijer et al. | |
| 8,219,833 | B2 * | 7/2012 | Basak et al. | 713/300 |
| 8,219,834 | B2 * | 7/2012 | Basak et al. | 713/300 |
| 8,373,493 | B2 * | 2/2013 | Chakrabarty et al. | 327/427 |
| 8,395,440 | B2 * | 3/2013 | Sandhu et al. | 327/540 |
| 8,456,223 | B2 * | 6/2013 | Myers et al. | 327/534 |
| 8,519,775 | B2 | 8/2013 | Idgunji et al. | |
| 2008/0165608 | A1 | 7/2008 | Choi et al. | |
| 2010/0097101 | A1 | 4/2010 | Chua-Eoan et al. | |
| 2012/0062308 | A1 | 3/2012 | Chakrabarty et al. | |
| 2012/0200345 | A1 * | 8/2012 | Kim | 327/543 |
| 2013/0027123 | A1 | 1/2013 | Idgunji et al. | |
| 2013/0120045 | A1 | 5/2013 | Hegde | |

OTHER PUBLICATIONS

Singh, Harmander et al. "Enhanced Leakage Reduction Techniques Using Intermediate Strength Power Gating." IEEE Transactions on Very Large Scale Integration (VLSI) Systems vol. 15, No. 11, Nov. 2007 pp. 1-10.

* cited by examiner ial Patent Application which is hereby incorporated by
DIGITAL POWER GATING WITH STATE RETENTION

CROSS REFERENCE TO RELATED APPLICATION(S)

This application claims priority to the following U.S. Provisional Patent Application which is hereby incorporated by reference in its entirety for all intents and purposes.

| SERIAL NUMBER | FILING DATE | TITLE |
| --- | --- | --- |
| 61/831,544 | Jun. 05, 2013 | DIGITAL POWER GATING WITH DATA RETENTION |
| 61/930,356 | Jan. 22, 2014 | DIGITAL POWER GATING WITH STATE RETENTION |

This application is related to the following co-pending U.S. Patent Applications, each of which has a common assignee and common inventors.

| SERIAL NUMBER | FILING DATE | TITLE |
| --- | --- | --- |
| (CNTR.2719) | — | DIGITAL POWER GATING WITH GLOBAL VOLTAGE SHIFT |
| (CNTR.2720) | — | DIGITAL POWER GATING WITH CONTROLLED RESUME |
| (CNTR.2731) | — | DIGITAL POWER GATING WITH PROGRAMMABLE CONTROL PARAMETER |

BACKGROUND OF THE INVENTION

1. Field of the Invention

The present invention relates in general to power gating, and more particularly, to digitally controlling a gated supply voltage of a circuit including quickly and gracefully reducing the supply voltage to a level that allows the circuit to retain its state while reducing leakage current, and quickly and gracefully increasing the supply voltage for resumption of operations.

2. Description of the Related Art

Complementary MOS (CMOS) circuitry dissipates less power and is more dense than other types of integrated circuit (IC) technologies so that CMOS technology has become the dominant style of digital circuit design for integrated circuits. CMOS circuits use a combination of N-channel (NMOS) and P-channel (PMOS) devices or transistors each having a threshold gate-to-source voltage based on design, scale, materials and process. As IC design and fabrication techniques continue to evolve, operating voltages and device sizes have each scaled downward. As device sizes and voltage levels have decreased, the channel lengths and oxide thicknesses of each device have also decreased. Manufacturers have also switched to gate materials causing lower threshold voltages which has further led to increased sub-threshold leakage current. Sub-threshold leakage current is the current that flows between the drain and source when the gate-to-source voltage is below the threshold voltage of the CMOS device. In such conventional configurations the sub-threshold leakage current may account for nearly 15-30% or more of total power consumption in the dynamic environment (e.g., during normal operation).

For certain periods of time and/or under certain circumstances a CMOS circuit or a portion thereof may become idle in which it does not provide useful work. Maintaining full power to the idle circuit is wasteful and inefficient since sub-threshold leakage current continues to flow consuming valuable energy. For legacy CMOS technologies, the sub-threshold leakage current was reduced by adjusting the voltage of the bulk or body connections of the CMOS devices. This technique has not been as effective for current CMOS technologies at 40 nanometer (nm) and 28 nm and the like.

SUMMARY OF THE INVENTION

A digital power gating system for controlling a supply voltage of a functional circuit as described herein reduces a supply voltage of the functional block to a state retention level so that leakage current is reduced while a digital state of the functional block is retained. The functional block may be of any type, such as a processor core or the like. The integrated circuit includes a non-gated or global supply bus and a gated supply bus that provides the gated supply voltage. The digital power gating system includes multiple gating devices and a power gating control system. Each of the gating devices has a pair of current terminals coupled between the global supply bus and the gated supply bus, and each has a control terminal controlled by at least one bit of a digital control value. Each control bit controls activation of a corresponding subset of the gating devices. The power gating control system is configured to perform power gating by successively adjusting the digital control value to reduce a voltage of the gated supply bus to a state retention voltage level that reduces leakage current while retaining a digital state of the functional circuit.

In one embodiment, one bit controls many of the gating devices whereas other bits of the digital control value are binarily weighted. The power gating control system may include a digital adjuster that reduces the gated supply bus by combining a digital adjustment value with the digital control value for each of sequential adjustment periods until the gated voltage reaches the state retention voltage level. The digital adjustment value may be configured to maintain a constant gain during power gating. For example, the digital adjustment value may be a shifted version of the digital adjustment value, in which the digital adjustment value is then combined with (e.g., subtracted from) the current digital control value to update the digital control value.

The digital adjustment value may be modified during power gating to adjust gain, such as when the digital control value reaches certain predetermined values or when the gated voltage reaches certain voltage thresholds. A voltage comparator may be included to compare the gate voltage level with one or more threshold voltage levels including the state retention voltage level.

The rate of adjustment may be adjusted during power gating, such as when the digital control value reaches certain values or when the gated voltage level reaches certain levels. For example, the rate of adjustment may be reduces as the voltage gated approaches a target voltage level.

The rate of adjustment may be controlled by a clock signal. A clock controller may be provided to develop a clock signal and to modify a period of the clock signal to control the rate of adjustment. For example, the period of the clock signal may start at a relatively low level (for a faster rate of adjustment) and then may be increased during power gating to slow the rate of change of the gated supply voltage. The clock period may be adjusted based on various factors or thresholds. In one embodiment, the clock period is adjusted based on the value of the digital control value itself. For example, as the digital control value is decreased during power gating, the clock period is increased for certain predetermined conditions or programmed digital control values. The clock period may also be adjusted based on voltage thresholds of the gated voltage supply. For example, when the gated supply bus reaches certain voltage threshold levels above the state retention voltage level, the clock period may be adjusted (e.g., increased) to control the rate of change of the gated supply voltage.

Various control parameters may be programmable. Any number of threshold voltages may be defined, and each may have any suitable threshold level depending upon the particular implementation. One or more voltage comparators each compare the gated supply voltage (e.g., VDD1) with one of any number of threshold voltages for adjusting operation, including adjusting gain (which may control the amount of adjustment) and/or a clock period (which may control the rate of adjustment). Programmable fuses or scanned values or the like may be used for adjusting corresponding operating parameters and values for controlling power gating functions. For example, a subtract and/or add gain may be used for adjusting the digital control value (and thus the gain) during power gating or resumption. Additional clock shift values may be programmed to adjust the clock period during power gating.

An integrated circuit according to one embodiment includes one or more functional blocks, each having a voltage supply input coupled to a corresponding gated supply bus, and each including a digital power gating system for controlling its supply voltage. Each gating device may implemented in a suitable manner, such as a PMOS or NMOS transistor or the like. The integrated circuit may include a power controller that places a functional block in an idle mode, that turns off a clock signal provided to the functional block, and that asserts a gating control signal to cause the power gating control system to reduce the voltage of the gated supply bus provided to the functional block to a state retention voltage level.

A method of power gating a supply voltage provided to a functional block according to one embodiment includes providing a digital control value that controls activation of each of multiple current devices coupled between a non-gated supply bus and a gated supply bus, asserting the digital control value to activate a sufficient number of the current devices to clamp the voltage of the gated supply bus to the non-gated supply bus during a full power mode, and, in response to receiving a gate control signal, performing power gating by periodically adjusting a magnitude of the digital control value until the voltage of the gated supply bus reaches a state retention voltage level that reduces leakage current while retaining a digital state of the functional block.

The method may include binarily weighting a subset of bits of the digital control value. The method may include comparing the voltage of the gated supply bus with multiple threshold voltages. The method may include periodically combining the digital control value with a digital adjustment value. The method may include providing the digital adjustment value as a shifted version of the digital control value. The method may include comparing a voltage of the gated supply bus with at least one threshold voltage, selecting one of multiple shifted versions of the digital control value as a first digital adjustment value, and selecting a different shifted version of the digital control value when the voltage of the gated supply bus reaches each of one or more threshold voltages. The method may include selecting a different shifted version of the digital control value when the digital control value reaches each of one or more predetermined values.

The method may include comparing a voltage of the gated supply bus with at least one threshold voltage. The method may include providing a clock signal for controlling adjustment of the digital control value. The method may include providing the clock signal at an initial period, and changing the period of the clock signal when the voltage of the gated supply bus reaches each of one or more threshold voltages, or when the digital control value reaches each of one or more predetermined values. The method may include converting a subset of bits of the digital control value to multiple period adjust values, and changing the period of the clock signal when any of the period adjust values becomes true.

Full power gating is also disclosed to be applied if and when desired. Resume operations are shown and described for resuming operations from partial or full power gating to full voltage for normal operation. Many of the resume functions are programmable, such as resume gain, resume completion, resume clock period control, etc. For example, a constant resume clock may be selected along with the resume clock period.

Global voltage shift compensation is contemplated in the event that the non-gated voltage supply is shifted during power gating operation. A shift of the non-gated global supply voltage might otherwise cause an undershoot of the target state retention voltage level potentially jeopardizing state retention. A global control adjuster receives one or more signals indicating the relative size of the global voltage change and adjusts the digital control value accordingly to avoid undershoot of the gated voltage.

BRIEF DESCRIPTION OF THE DRAWINGS

The benefits, features, and advantages of the present invention will become better understood with regard to the following description, and accompanying drawings where.

DETAILED DESCRIPTION

Figure 1:
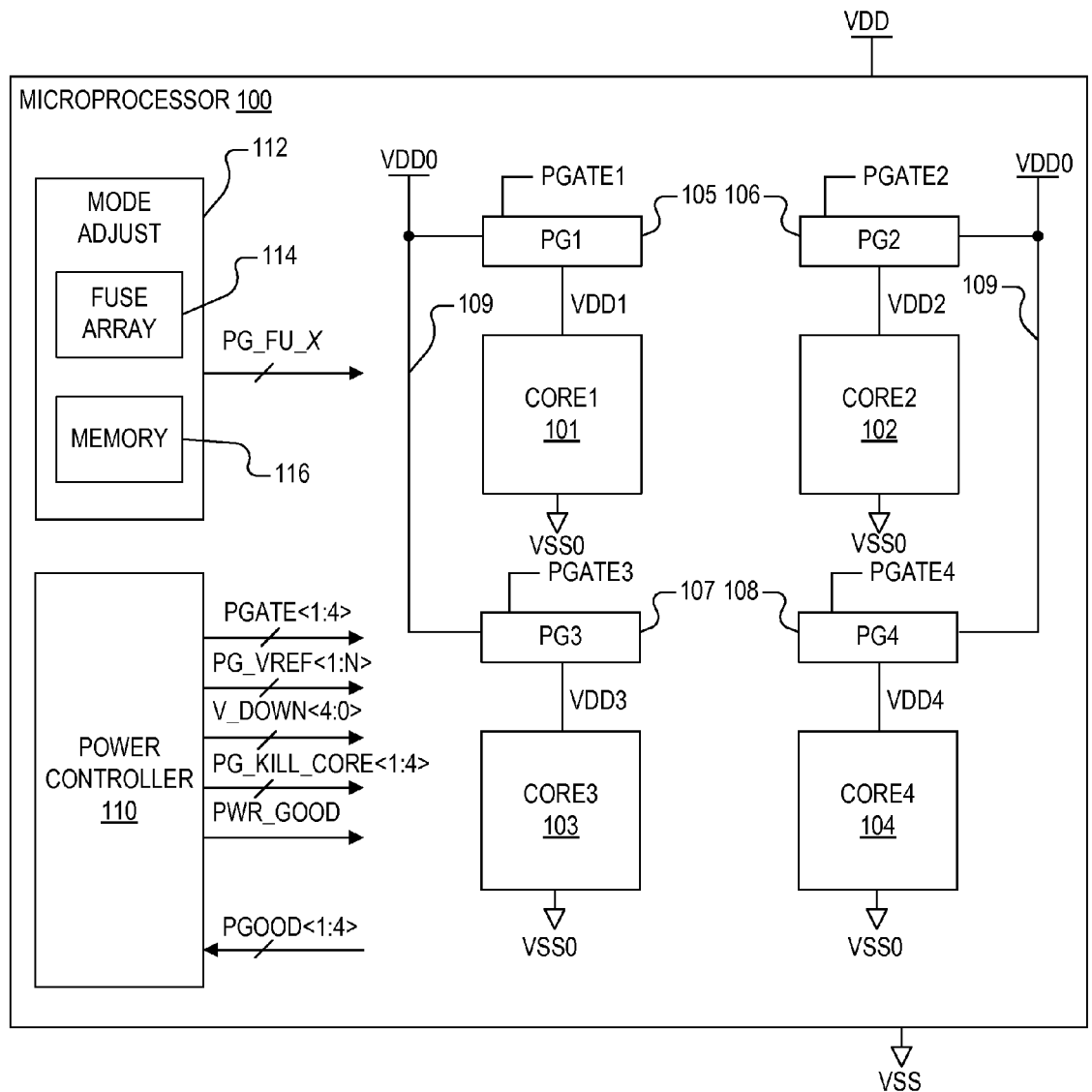
FIG. 1 is a simplified block diagram of a multiple core (multicore) microprocessor implemented according to an embodiment of the present invention.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Conventional power gating has been rather crude or otherwise based on analog techniques. Conventional power gating also typically forced full power gating in which the source voltage is effectively removed, so that any stored data or logical state of the circuit, such as retained in data storage devices including memory or registers or the like, is lost. In many circumstances, it may be desired to retain the state or data of the circuit so that operations may be resumed at a later time.

In order to retain the state of the circuit prior to full power gating, the stored data or information had to be copied into another storage device or memory that is static or otherwise remains powered during power gating of the circuit. As used herein, "state retention" is intended to refer to the "state" of the circuit including any information or data stored in the circuit, including the state of dynamic devices such as registers, flip-flops, latches, dynamic memory devices, etc. Upon power up, the stored information had to be restored back into the circuit before operation could be resumed. The storage used to save the information, such as an on-chip cache or the like, must either remain powered or otherwise comprise static storage that retains the information while power is removed. Storing and retrieving the information is costly in terms of performance because a significant amount of time was required for saving the information to enter power gating and for retrieving the information to resume operations. The cost of conventional power gating is particularly high for a large scale circuit, such as a microprocessor core or processor of a system-on-chip or the like.

The inventor has recognized the inefficiencies of conventional power gating including wasteful latency particularly when it is desired to save state information during power gating. He has therefore developed digital power gating with state retention in which the supply voltage to a circuit is reduced to a target level that ensures state retention while reducing or otherwise minimizing leakage current. A novel digital control system and method has been developed to control the voltage of the distributed supply voltage in a digital manner to a target voltage level during power gating. The digital control system and method also incorporates global voltage shift during power gating to momentarily increase the voltage of the gated supply bus to prevent it from falling below a state retention voltage level in response to an impending change of a voltage of the global supply bus. The digital control system and method further gracefully controls the increasing of the supply voltage level back to its normal operating voltage level when prompted for resumption of operations such as in response to a resume indication. In addition, the digital control system and method may include at least one programmable control parameter to program operation during power gating and controlled resume. In this manner, power may be saved and operations may be resumed from the point in time just prior to power gating since the stored information in dynamic devices, such as including registers, flip-flops, latches, dynamic memory devices, etc., remains intact. Full power gating is also implemented along with controlled resume from full power gating, and full power gating may include at least one programmed parameter.

FIG. 1 is a simplified block diagram of a multiple core (multicore) microprocessor 100 implemented according to an embodiment of the present invention. The microprocessor 100 includes four cores CORE1 101, CORE2 102, CORE3 103 and CORE4 104 (cores 101-104), each coupled to a respective one of four power gating systems PG1 105, PG2 106, PG3 107 and PG4 108 (power gating systems 105-108). Although four cores 101-104 are shown, any number of cores more or less than four are contemplated. Also, whereas each core may be a microprocessor core used for purposes of illustration, it is understood that any other circuit type or function for which power gating is desired is contemplated. The microprocessor 100 is implemented on an integrated circuit (IC) or semiconductor chip or the like, in which other circuitry (not shown) may be included.

Each of the power gating systems 105-108 receives a corresponding one of four power gate control signals PGATE<1:4>, individually shown as PGATE1, PGATE2, PGATE3 and PGATE4, where each power gate control signal is used for independently power gating a corresponding one of the cores 101-104. In an alternative embodiment, power gating may be simultaneously applied at a global level to each of the cores 101-104. For example, the PGATE1, PGATE2, PGATE3 and PGATE4 signals may be replaced or otherwise controlled by a single global control signal. The microprocessor 100 receives an external power supply voltage defined between source voltages VDD and VSS, in which VSS is a suitable reference voltage level such as ground. VDD and VSS are globally distributed as corresponding global supply voltages VDD0 and VSS0, which are provided to each of the power gating systems 105-108. VSS0 is shown distributed to each of the cores 101-104. VDD0 is distributed on conductive plane or set of conductors collectively forming a global supply bus 109.

As shown, the power gating system 105 converts supply voltage VDD0 into a first gated supply voltage VDD1 provided to CORE1 101, the power gating system 106 converts VDD0 into a second gated supply voltage VDD2 provided to CORE2 102, the power gating system 107 converts VDD0 into a third gated supply voltage VDD3 provided to CORE3 103, and the power gating system 108 converts VDD0 into a fourth gated supply voltage VDD4 provided to CORE4 104.

During a full power mode for a given one of the cores 101-104, the corresponding power gate control signal PGATE1-PGATE4 is negated and the corresponding power gating system 105-108 turns on or activates a predetermined full power number of P-type or P-channel devices, otherwise referred to herein as power gating devices. The predetermined full power number is sufficient to effectively clamp the corresponding gated supply voltage VDD1-VDD4 to VDD0 to minimize the resistive path between VDD0 and the corresponding gate supply voltage to maximize power distribution to the selected core.

In one embodiment, the P-type power gating devices comprise PMOS transistors or the like. As further described herein, digital power gating for a given core is performed by turning off selected ones of the PMOS transistors over a period of time to reduce power distribution to the selected core. In an alternative embodiment, NMOS transistors or the like may be used as the power gating devices, in which they are distributed to the power gating system 105-108 and coupled between the global reference voltage VSS0 and corresponding local reference voltages provided to the cores 101-104 (e.g., VSS1, VSS2, VSS3 and VSS4, not shown).

As understood by those of ordinary skill in the art, a significant level of current leakage occurs for each microprocessor core during the full power mode. Although technology has improved to reduce the amount of leakage, even advanced technology suffers from current leakage consuming power at a significant level, such as about 15% or more of the total power consumption. It is also known that not all of the cores 101-104 need to be active all of the time. Thus, one or more of the cores 101-104 may be power gated or otherwise placed in a lower power mode to reduce power consumption during periods of inactivity or reduced activity. In fact, it has been determined that it is very rare for all of the cores of a given multiprocessor configuration, including the microprocessor 100, be active at any given time. Thus, during normal operation, at least one of the cores 101-104 may be power gated to reduce overall power consumption.

A digital power gating system and method as described herein provides for full power gating in which any one or more of the cores 101-104 may be effectively shut down if desired without saving state information. Full power gating is advantageous when one or more of the cores 101-104 are not necessary for current operations and any saved information therein is not needed. Although a given core may be power gated during idle periods of time, it may be desired to save the state of the core in order to resume operations at a later time. In conventional power gating configurations, the entire state of a core was stored within an on-chip memory or the like (not shown) which remained powered. Then the power provided to the core was effectively shut down by disconnecting either VDD or VSS provided to that core. When it was desired to reactivate the powered-down core, power was restored, the state was retrieved from the memory, and operation was then resumed.

There is a significant level of inefficiency associated with conventional power gating which directly impacts overall performance. In particular, a substantial amount of delay is incurred since a significant number of clock cycles are required to complete each transfer to and from a separate memory to save and retrieve state information. Thus, there was significant delay during both power-down and power-up. It is desired to reduce the delay when power gating any one or more of the cores 101-104 to substantially improve overall performance.

In the illustrated configuration of the microprocessor 100, each of the power gating circuits 105-108 performs digital power gating in response to assertion of a corresponding one of the power gate control signals PGATE1-PGATE4 (or PGATE<1:4>). When it is desired to power gate a given one of the cores 101-104, the selected core is placed into an idle mode and internal clocks of that core are turned off. Even in the idle state, a significant level of power is consumed due to leakage current. Full power gating would cause a corresponding loss of the state of the core including any data or information stored in that core. Instead, in response to assertion of the corresponding one of the power gate control signals PGATE1-PGATE4, the corresponding power gating circuit turns off selected groups of its PMOS devices to reduce the gated supply voltage provided to the core over selected periods of time. The target gated supply voltage is less than the full supply voltage power level but sufficient to retain the state information of the core while also substantially reducing power loss due to leakage current.

A resumption procedure or operation is performed when it is desired to return the power gated core back to full power level to resume operations. In particular, in response to negation of the corresponding one of the power gate control signals PGATE1-PGATE4, the corresponding power gating circuit selectively re-activates PMOS devices in stages to increase the supply voltage provided to the core over selected and/or programmable periods of time. When the full supply voltage is restored, the core is pulled out of its idle state and operations may be resumed.

Each of the power gating periods for reducing power and resuming power are substantially shorter than the conventional state-saving periods for storing and retrieving core state. Thus, delays for entering and exiting the power gating mode are minimized thereby substantially improving overall performance.

In one embodiment, the supply voltage VDD0 is approximately 1 Volt (V), or about 1.05V for full power mode. It is understood that VDD0 may vary depending upon the implementation or particular power mode, such as between 0.95V-1.15V or the like. During the power gating mode, the gated supply voltage (e.g., one or more of the VDD1-VDD4 supply voltages) is reduced to a level of approximately 450 milli-Volts (mV) to reduce or otherwise minimize leakage current while maintaining the state of the core. It is understood that the particular voltage levels may be different for different semiconductor technologies and that these specific voltage levels are exemplary only. The present invention is equally applicable to other technologies at different voltage levels in which it is desired to reduce or otherwise minimize leakage current while maintaining the logic state of a circuit, such as a microprocessor core or the like.

In one embodiment, the microprocessor 100 includes a power controller 110 that provides various control signals to control the power state and to further control the power gating function of the cores 101-104. When it is desired to power gate a given one (or more) of the cores 101-104, the power controller 110 places one or more of the cores 101-104 into an idle mode and turns off corresponding internal clock signals. Then the power controller 110 asserts the corresponding one or more of the power gate control signals PGATE1-PGATE4 (shown as PGATE<1:4>) to power gate the corresponding core(s).

When it is desired to resume operation of a power gated core, the power controller 110 negates the corresponding power gate control signal PGATE<1:4> and waits until the gated supply voltage has returned to normal operating level and the resume process is completed. Each of the power gating circuits 105-108 asserts a corresponding one of power good signals PGOOD<1:4> to the power controller 110 indicating that the resumption process has completed and its gated supply voltage has stabilized to the voltage level of VDD0. Then the power controller 110 commands that the one or more core functional clock signals are re-activated, and the core may resume operations.

The power controller 110 may further provide one or more reference voltages PG_VREF<1:N> used for controlling the power gating process performed by each of the power gating systems 105-108. The number "N" of reference voltages is any suitable number for a given configuration or implementation. The number N may be one in which only one reference voltage is provided A single reference voltage may represent, for example, the target voltage level of the gated supply voltages VDD1-VDD4 for reducing leakage while retaining the digital state of the cores. In another embodiment, two reference voltages (e.g., N=2) may be provided, such as PG_VREF_L and PG_VREF_H. PG_VREF_L indicates the target voltage level for the gated supply voltages VDD1-VDD4 during power gating, whereas PG_VREF_H indicates a slightly higher voltage level than the target level indicated by PG_VREF_L.

Additional reference voltages including intermediate control voltage levels and multiple target voltages may be defined and provided. Alternatively, the reference voltages PG_VREF<1:N> may be replaced by one or more programmable voltage levels. One or more of the reference voltages may be provided externally from external sources.

The power controller 110 may also provide V_DOWN<4:0> signals to the power gating systems 105-108 to adjust operation during power gating as further described herein. In some cases or under certain operating conditions, the supply voltage VDD0 is changed to a lower value. The power controller 110 asserts one of the V_DOWN<4:0> signals before changing VDD0 to a new voltage level, in which assertion of the particular one of the V_DOWN<4:0> bits indicates the magnitude of the voltage decrease of VDD0. During power gating when one or more of the gated supply voltages VDD1-VDD4 is being reduced to a state retention level, additional reduction of VDD0 could otherwise cause one or more of the gated supply voltage(s) (e.g., VDD1) to drop below a target voltage level. If, for example, the target voltage level is the voltage level that assures state retention of the corresponding core, reduction of VDD0 without further correction may cause undershoot of the retention voltage potentially jeopardizing state retention. The asserted one of the V_DOWN<4:0> signals serves as a one-time adjust that enables the power gating systems 105-108 to adjust power gating operation accordingly to prevent undershoot of the target voltage level.

The power controller 110 asserts a corresponding one of signals PG_KILL_CORE<1:4> to initiate full power gating for a corresponding core in which the gated supply voltage is decreased to about (or near) zero, such as when it is desired to shut down the core or when there is no need to store the state information of the core during a reduced power mode.

A signal PWR_GOOD indicates that the global supply voltage VDD0 has stabilized to its normal operating voltage level. Although shown provided by the power controller 110, the PWR_GOOD may be provided from, or otherwise derived from, an external source (e.g., from a motherboard or the like) indicating that the supply voltage VDD0 is stable and valid. During power on or reset (POR) and before being asserted, the PWR_GOOD signal may be used to initialize the power controller 110 and the power gating signals.

Various other programmable control signals PG_FU_X are used for controlling power gating operations and mode of operation. The "FU" notation denotes values determined by fuses or scanned values or the like for adjusting corresponding operating parameters and values for the microprocessor 100. Scanned values may be data or register values programmed into the IC during testing, such as JTAG boundary scan or the like. The described configuration provides many levels of static and dynamic programmability of operation. During manufacture or for a given implementation, operation may be tested empirically and corresponding desired operating parameters determined. Fuses may then be used to statically program operating parameters for optimal results. Scan inputs and fuses may be wired-OR'd to enhance testing and static programming. The power controller 110 may be configured to provide the PG_FU_X signals or assert or otherwise provide other control signals to control the power gating process.

In the illustrated embodiment, a mode adjust block 112 may be included for providing the PG_FU_X signals to control or adjust the mode of operation for power gating functions. The mode adjust block 112 includes a fuse array 114 and a memory 116. Either one of the fuse array 114 or the memory 116 or any combination thereof may be used to program any one or more of the PG_FU_X signals. The fuse array 114 includes multiple fuses that may be programmed to statically set one or more of the PG_FU_X signals. For example, each fuse may be programmed by addressing or directing a particular fuse to be exposed to an external pin (not shown), in which a sufficiently high voltage is applied to the external pin to blow the fuse. The fuse providing an electrical short for implementing a first or default mode of operation becomes an open circuit to implemented a second or programmed mode of operation. The memory may be configured to either statically or dynamically set one or more of the PG_FU_X signals. For example, the memory may include static memory, such as a ROM or the like, which is programmed to set one or more of the PG_FU_X signals. The memory may be a RAM or register or the like that is dynamically programmed to set one or more of the PG_FU_X signals during operation, such as at power up and/or boundary scan or the like.

Figure 2:
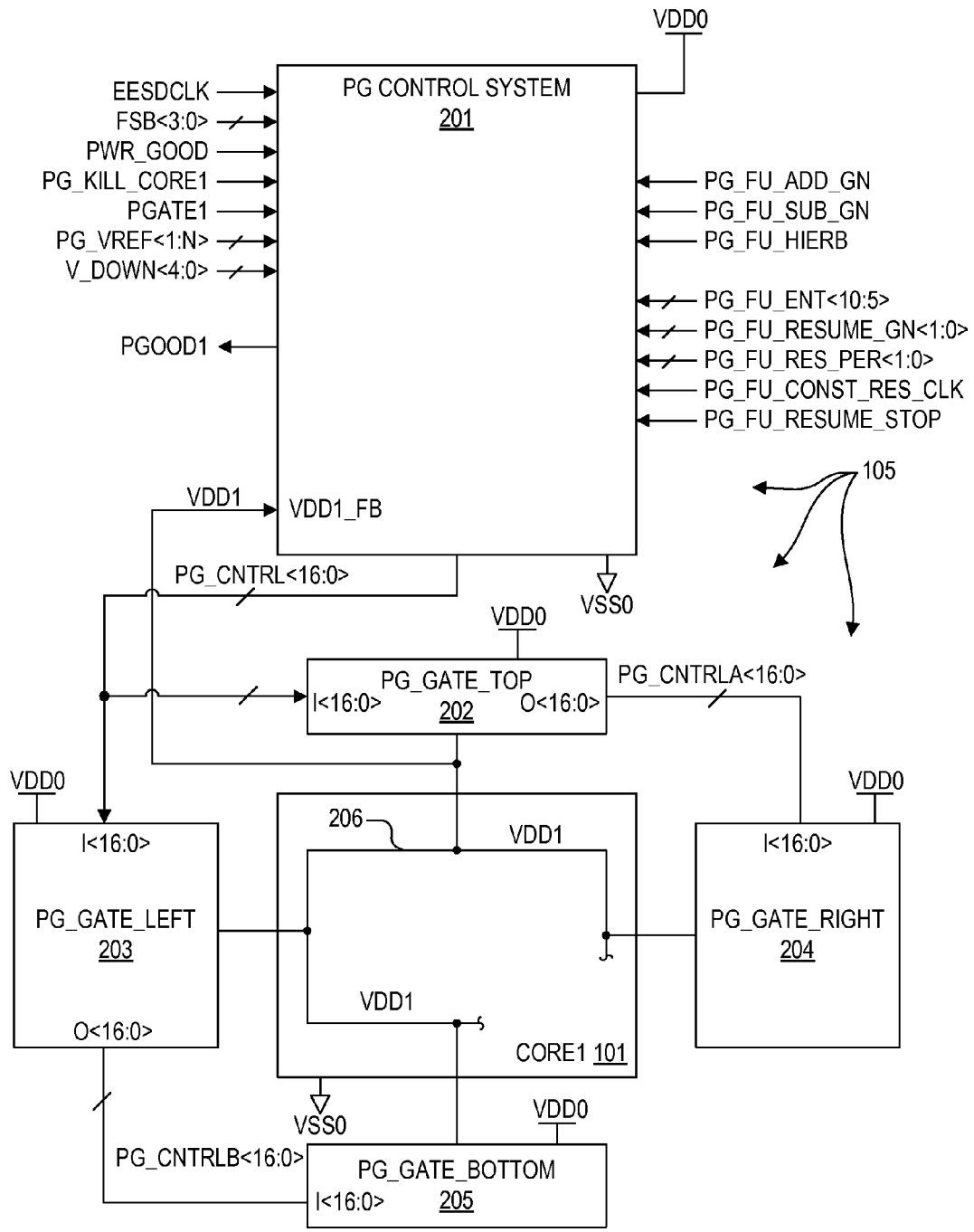
FIG. 2 is a block diagram of a core coupled to a corresponding power gating system of FIG. 1 implemented according to an embodiment of the present invention.

FIG. 2 is a block diagram of the core 101 (CORE1) coupled to the power gating system 105 (PG1) implemented according to an embodiment of the present invention. The core 101 and power gating system 105 are representative of each of the other core and power gate control circuit pairs shown in FIG. 1, in which each may be implemented in substantially the same manner. In the illustrated embodiment, the power gating system 105 includes a PG control system 201 and multiple gating circuits, individually shown as PG_GATE_TOP 202, PG_GATE_LEFT 203, PG_GATE_RIGHT 204 and PG_GATE_BOTTOM 205 provided along the top, left, right and bottom sides, respectively, of the core 101. As further described herein, each of the gating circuits includes multiple power gating devices which are shown as distributed about the periphery of the core 101. In an alternative embodiment, the power gating devices may be configured as a distributed power gating array incorporated within the core 101. Relative to any one or more of the cores 101-104, both internal and external power gating devices are contemplated.

The core 101 is referenced to VSS0 and includes, or is otherwise coupled to, a gated supply bus 206 developing the gated supply voltage VDD1 for the core 101. Although not shown, the core 101 includes a substantial number of internal PMOS transistors and NMOS transistors and many other circuit elements for performing processing functions as understood by those of ordinary skill in the art. The CMOS devices of the core 101 exhibit significant current leakage during full power conditions. In the illustrated embodiment, the PG control system 201 provides a 17-bit control word PG_CNTRL<16:0> that controls the voltage level of VDD1 relative to VDD0 during power gating as further described herein. VDD1 is fed back to the PG control system 201 via an input VDD1_FB.

The PG control system 201 receives VDD0 (or a version thereof) so that it may remain powered up during power gating of the core 101 to maintain power gating control and operation. The PG control system 201 receives a clock signal EESDCLK and a 4-bit front side bus value FSB<3:0> indicating the frequency of a bus clock. The EESDCLK and FSB<3:0> signals are used to establish and adjust the period of at least one internal clock signal, PG_CLK, used for power gating timing as further described herein. The PG control system 201 receives the PWR_GOOD signal which is asserted by the power controller 110 to indicate that the supply voltage VDD0 has stabilized to its normal operating voltage level. When the PWR_GOOD signal is not asserted, the PG control system 201 is reset or initialized. VDD1 generally follows the voltage level of VDD0 during power up or reset.

The PG control system 201 receives a signal PG_KILL_CORE1, which is a corresponding one of the PG_KILL_CORE<1:4> signals provided by the power controller 110 for the core 101. PG_KILL_CORE1 is asserted to initiate full power gating for the core 101 in which VDD1 is decreased to about (or near) zero, such as when it is desired to shut down the core 101 or when there is no need to store the state information of the core 101 during a reduced power mode. The PG_KILL_CORE1 is ignored (and/or a corresponding signal KILL is not asserted) when the PWR_GOOD signal is not asserted during power up.

The PG control system 201 receives a power gate control signal PGATE1, which is a corresponding one of the PGATE<1:4> signals received from the power controller 110 indicating whether to invoke or release power gating for the core 101. PGATE1 is asserted to initiate power gating for the core 101 and negated to exit power gating and resume normal operations.

The PG control system 201 receives the reference voltages PG_VREF<1:N>. As further described herein, one or more of the PG_VREF<1:N> reference voltages are compared to VDD1 (via VDD1_FB) to monitor the progress of power gating application and/or resumption of normal operations as further described herein. In one embodiment, for example, the PG control system 201 compares the voltage level of VDD1 with one or more reference voltages to identify when VDD1 achieves certain thresholds while entering and/or exiting power gating. It is understood that any number of reference voltage levels may be developed and/or received and used for controlling power gating as further described herein.

The PG control system 201 receives the V_DOWN<4:0> signals, which are used as a one-time adjust of the control word control word PG_CNTRL<16:0> (or simply, PG_CNTRL), under certain conditions. The power controller 110 may assert one of the V_DOWN<4:0> signals to intentionally change VDD0 to a reduced voltage level for a reduced power state. In some embodiments, external or internal decoupling capacitors may be provided within the core 101 and coupled to the gated supply voltage VDD1. If the capacitors are not present, then the V_DOWN<4:0> signals might not be used or may otherwise be ignored. If, however, such capacitors are present in a given configuration or if a core has a significant amount of capacitance, then the total capacitance has the potential of significantly changing the resistor-capacitor (RC) time constant while adjusting VDD1 using the control word PG_CNTRL, particularly if VDD0 is also reduced. The "C" of the RC time constant represents the total capacitance of the core 101, and the "R" represents the total resistance of the activated power gating devices coupled in parallel between VDD0 and VDD1. As these devices are turned on or off, the total resistance changes thus changing the RC time constant.

The PG control system 201 detects assertion of a corresponding one of the V_DOWN<4:0> signals and adjusts the control word and VDD1 accordingly to compensate for the RC time constant to ensure sufficiently fast response and to avoid undershooting the target voltage level. This prevents (or otherwise minimizes the possibility of) VDD1 from dropping below a predetermined minimum voltage level (e.g., the target voltage level for state retention) which may cause a loss of the state information stored in the circuitry of the core 101.

The PG control system 201 asserts a power good signal PGOOD1 to the power controller 110 when VDD1 is at normal operating level. PGOOD1 is a corresponding one of the PGOOD<1:4> signals previously described. In one embodiment, when power gating is invoked, the upper or most significant bit (MSB) of the control word PG_CNTRL<16:0>, or control bit PG_CNTRL<16>, is turned off or de-asserted first to turn off a corresponding number of PMOS devices. The resumption process may be considered completed when this MSB bit or PG_CNTRL<16:0> of the control word is re-asserted. PGOOD1 may be derived or directly asserted based on the state of PG_CNTRL<16:0>.

The PG_FU_X signals are provided to the PG control system 201 for adjusting corresponding operating parameters and values and the like. These parameters are programmable and may be set by fuse or scan or the like. Various signal names with an "GN" notation denote values used to adjust gain of corresponding operating parameters and values. For example, a PG_FU_ADD_GN value may be used to adjust an add value used for increasing the control word PG_CNTRL (such as during power gating mode at the static retention voltage level), and a value PG_FU_SUB_GN may be used to adjust a subtract value used for decreasing the control word PG_CNTRL (such as during power gating mode). The magnitude of the add or subtract value reflects the dynamic gain during voltage adjustment.

A value PG_FU_HIERB may be used to adjust the time base or period of adjustment when a particular threshold voltage is reached during power gating. In one embodiment, a binary signal HIER is asserted (as further described below) when VDD1 drops to a threshold level above a lower threshold level (HIGH) indicative of the target voltage level for data or state retention. When HIER is asserted, the period of the clock signal PG_CLK determining the adjustment period is increased to slow down the adjustments. The period adjustment may be a default value when the PG_FU_HIERB value is not provided or otherwise not asserted. The PG_FU_HIERB value may be used to change the amount of increase of the period of PG_CLK as further described herein.

During power gating, fuse or scan values may be used to adjust PG_CLK. For example, the bits of a value PG_FU_ENT<10:5> are set by fuses or the like to further shift the time base of PG_CLK. It allows the ability to tune based on various parameters of a given configuration. In one embodiment, the capacitance of a given core may be increased via external capacitors or the like thus modifying the RC time constant during the power gating process. Additional capacitance may increase the RC time constant which slows the response of adjustments. PG_FU_ENT<10:5> provides a programmable means to compensate for the additional capacitance or the like during power gating.

Various fuse or scan parameters may be used to adjust resume operation for exiting power gating when a signal RESUME is asserted as further described below. RESUME is generally asserted in response to either PGATE1 or PG_KILL_CORE1 being negated after power gating (partial or full). During the resume process, an adjustment value is added to the control word PG_CNTRL, in which a 2-bit value PG_FU_RESUME_GN<1:0> may be used to select from among different add values for adjusting resume gain. The period of PG_CLK may also be adjusted by fuse or scan. For example, a value PG_FU_CONST_RES_CLK may be used to select a predetermined constant period of PG_CLK during the resume process, in which a value PG_FU_RES_PER<1:0> is a programmable 2-bit value that may be used to adjust the period of PG_CLK to a fixed value. The predetermined period may be selected to ensure relatively fast return to normal operation without interrupting operation of surrounding cores or other circuitry. PG_FU_RESUME_STOP is a binary value that may be used to indicate when to stop control word adjustments and return the control word to the original level for normal operations.

Each of the gating circuits 202-205 may be configured in substantially the same manner and each has one or more inputs coupled to the global supply voltage VDD0 and one or more outputs coupled to the gated supply bus 206 to provide the gated supply voltage VDD1. In the illustrated embodiment, the PG control system 201 provides the control word PG_CNTRL<16:0> to control the voltage level of VDD1 relative to VDD0 during power gating as further described herein. The control word PG_CNTRL<16:0> is provided to corresponding inputs (I<16:0>) of the gating circuits 202 and 203. The PG_CNTRL<16:0> control word is buffered through the gating circuit 202 and provided at outputs (O<16:0>) as a buffered version PG_CNTRLA<16:0>, which signals are provided to corresponding inputs (I<16:0>) of the gating circuit 204. Similarly, the PG_CNTRL<16:0> control word is buffered through the gating circuit 203 and provided at outputs (O<16:0>) as a buffered version PG_CNTRLB<16:0>, which signals are provided to corresponding inputs (I<16:0>) of the gating circuit 205.

The notations "I" and "O" are references to input and output versions, respectively, of the control word "CNTRL" which is buffered through the gating circuits 202 and 203 and provided as buffered versions "CNTRLA" and "CNTRLB," respectively. The gating circuits 204 and 205 may be configured in substantially the same manner as the gating circuits 202 and 203 even if buffered outputs are not further distributed (and may otherwise be electrically terminated). The control word PG_CNTRL<16:0> may also be generally referred to herein as PG_CNTRL in which all of the bits <16:0> are assumed unless a subset of bits are referenced.

The distributed configuration illustrated by gating circuits (e.g., the power gating circuits 202-205) located about the periphery of a large circuit, such as the core 101, as illustrated in FIG. 2 is exemplary only of a particular embodiment and alternative configurations are contemplated. For example, the same or different gating circuits may alternatively be entirely incorporated within the circuit or core, or any suitable combination of gating circuit devices within and/or about the periphery of the circuit. Regardless of the configuration of the power gating circuits, each includes a portion of a distribution circuit for conveying and delivering each bit of the PG_CNTRL<16:0> control word to the control terminals of a corresponding subset of the power gating devices. The distribution circuit generally includes buffers or drivers or the like to maintain the signal integrity of each of the bits of the control word.

Figure 3:
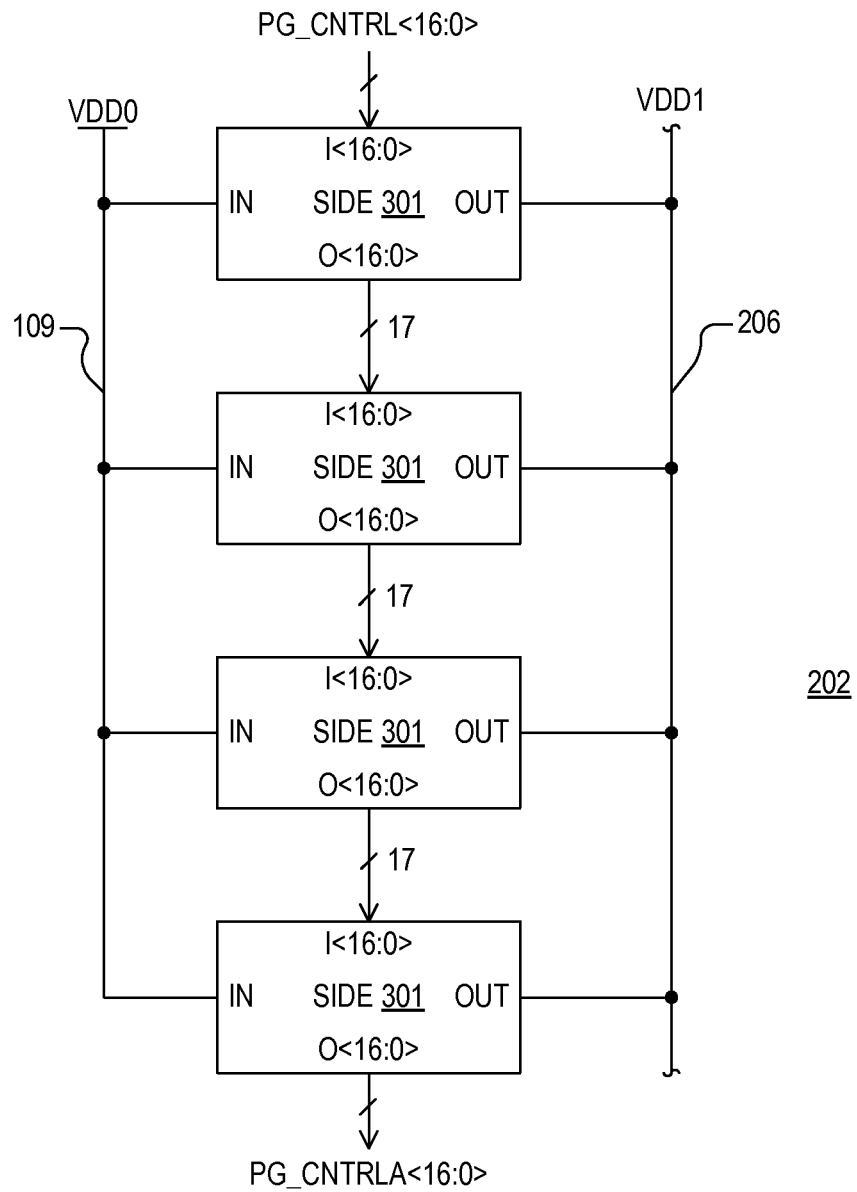
FIG. 3 is a simplified block diagram of the gating circuit PG_GATE_TOP of FIG. 2 and is representative of the remaining gating circuits according to one embodiment.

FIG. 3 is a simplified block diagram of the gating circuit PG_GATE_TOP 202 and is representative of the remaining gating circuits 203-205 (i.e., each are configured in substantially the same manner) according to one embodiment. The PG_GATE_TOP circuit 202 includes four separate and substantially identical side blocks 301 which are daisy chained together in serial fashion by the control word PG_CNTRL (e.g., between PG_CNTRL<16:0> and PG_CNTRLA<16:0>), each side block 301 receiving the control word PG_CNTRL or a buffered version thereof via corresponding inputs I<16:0> and providing buffer control words via corresponding outputs O<16:0>.

Each side block 301 further includes inputs coupled to the global supply bus 109 providing VDD0 and has outputs coupled to the gated supply bus 206 developing VDD1. In general, each bit of the PG_CNTRL<16:0> turns on a corresponding subset of devices with current terminals coupled between VDD0 and VDD1 and thus determines the relative current capacity or resistance between the supply voltages. When most (or even all) of the devices are turned on, then the current capacity is maximized and the resistance minimized so that VDD1 is effectively clamped to VDD0 and assumes substantially the same voltage level. As the devices are turned off during partial power gating or even full power gating, the voltage level of VDD1 drops relative to VDD0.

Figure 4:
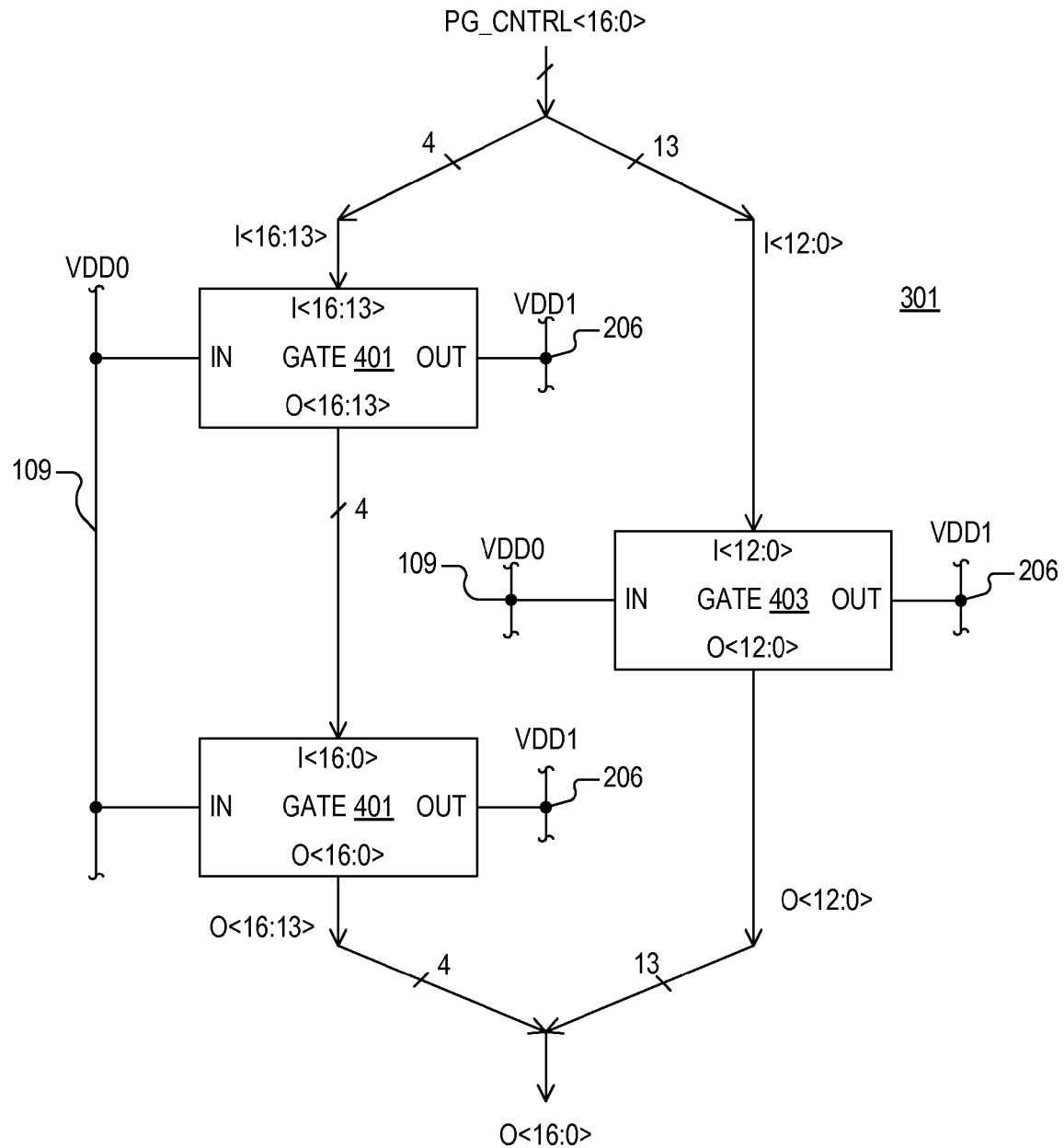
FIG. 4 is a simplified block diagram of each of the side blocks of FIG. 3 according to an one embodiment.

FIG. 4 is a simplified block diagram of each of the side blocks 301 according to an one embodiment. The side block 301 includes two separate and substantially identical gate blocks 401 daisy chained together in serial fashion via the upper bit portion of the control word PG_CNTRL<16:13> or buffered versions thereof. Each gate block 401 includes control word inputs I<16:13> and control word outputs O<16:13>. The side block 301 further includes another gate block 403 receiving the lower bit portion PG_CNTRL<12:0> of the control word or buffered versions thereof at inputs I<12:0> providing buffered control word outputs O<12:0>. Each gate block 401 and 403 has inputs coupled to the global supply bus 109 for receiving VDD0 and outputs coupled to the gated supply bus 206 for developing VDD1.

Figure 5:
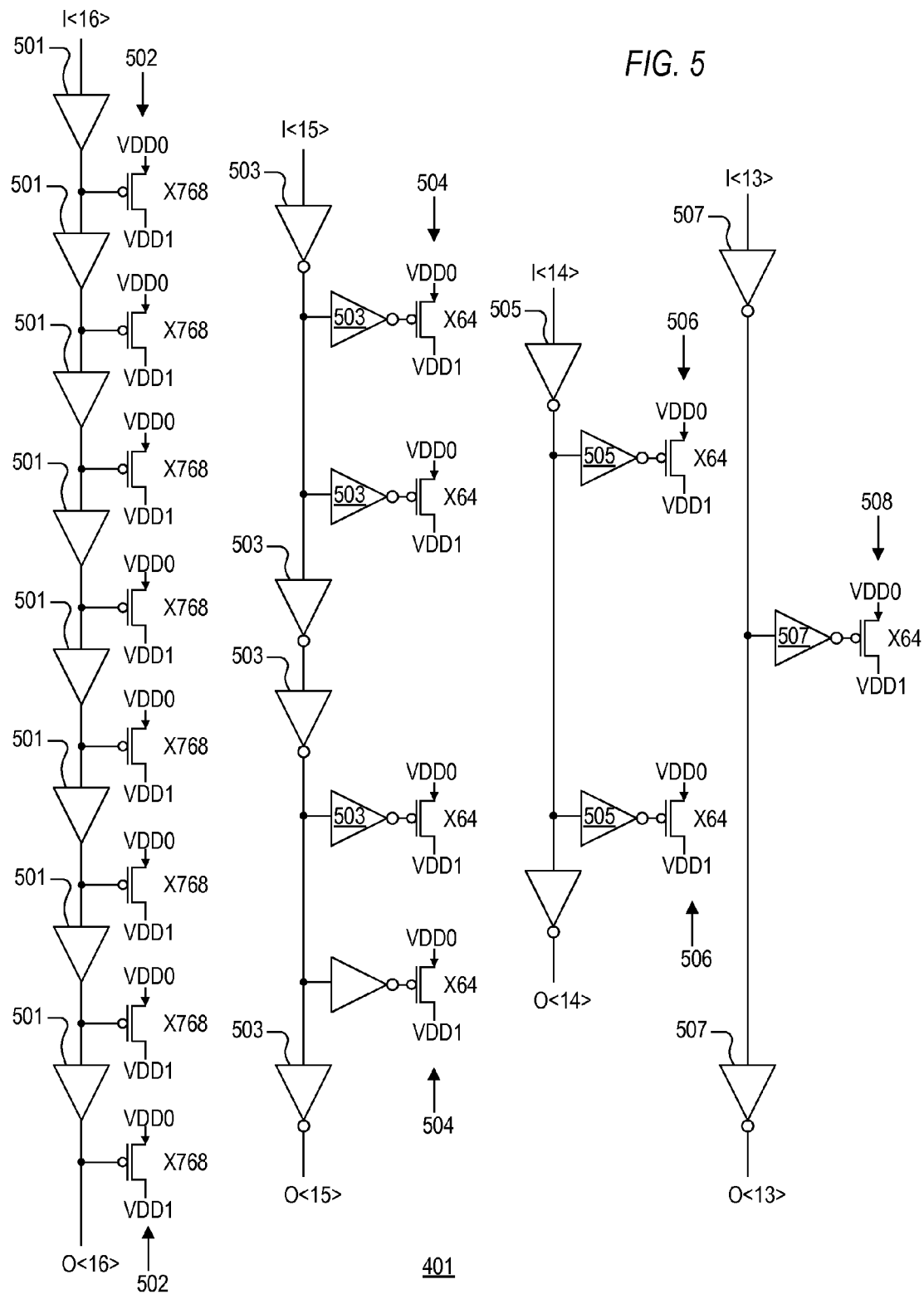
FIG. 5 is a schematic diagram of the gate block of FIG. 4 implemented according to one embodiment for upper bits of the control word.

FIG. 5 is a schematic diagram of the gate block 401 implemented according to one embodiment for upper bits of the control word. The upper control bit PG_CNTRL<16> of the control word controls buffered version I<16>, which is provided through a set of buffers 501 (e.g., 8 buffers 501) coupled in series for buffering the upper control bit and providing a buffered output control bit O<16>. At the output of each buffer 501, a set of PMOS transistors 502 are coupled in parallel, each having its gate coupled to a buffered version of the control bit PG_CNTRL<16>, a source coupled to VDD0, and a drain coupled to VDD1. In this manner, when PG_CNTRL<16> is asserted low, each PMOS transistor 502 of each transistor set is turned on to provide a corresponding one of multiple current paths between VDD1 and VDD0. When PG_CNTRL<16> is de-asserted high (or negated high), then the PMOS transistors 502 are turned off.

In one embodiment, each set of PMOS transistors 502 includes 768 PMOS transistors coupled in parallel. Each block has 8 sets as shown for each gate block 401, in which each side block 301 includes 2 gate blocks 401, and in which each of the gating circuits 202-205 includes 4 side blocks for a total of 196,608 PMOS transistors (or about 200K transistors) coupled in parallel and ultimately controlled by the control bit PG_CNTRL<16>. Since the gating circuits, side blocks and gate blocks are distributed around the core 101, and a similar structure is provided for each core, each core of the microprocessor 100 is surrounded by a distribution of a large number of PMOS devices controlled by the control bit PG_CNTRL<16>. In one embodiment, each PMOS transistor has a width of about 2 microns, for a total of about 393,216 microns of transistor material (or about 400K microns) controlled by the upper control bit PG_CNTRL<16>.

The next most significant control bit PG_CNTRL<15> of the control word controls buffered version I<15>, which is provided through a series of inverters 503 for buffering the control bit PG_CNTRL<15>. At the output of selected ones of the inverters 503, another set of inverters 503 controls a set of PMOS transistors 504 which are coupled in parallel, each having its gate coupled to an inverter output, a source coupled to VDD0, and a drain coupled to VDD1. In this manner, when PG_CNTRL<15> is asserted low, each PMOS transistor 504 of each transistor set is turned on to provide a corresponding one of multiple current paths between VDD1 and VDD0. When PG_CNTRL<15> is de-asserted high, the PMOS transistors 504 are turned off.

In one embodiment, each set of PMOS transistors 504 includes 64 PMOS transistors coupled in parallel. Each gate block 401 has 4 sets as shown, in which each side block 301 includes 2 gate blocks 401, and in which each of the gating circuits 202-205 includes 4 side blocks for a total of 8,192 PMOS transistors coupled in parallel and ultimately controlled by the control bit PG_CNTRL<15>. In one embodiment, each PMOS transistor has a width of about 2 microns, for a total of about 16,384 microns of transistor material controlled by the control bit PG_CNTRL<15>. Thus, each core of the microprocessor 100 is surrounded by a distribution of a number PMOS devices controlled by the control bit PG_CNTRL<15>, although the number is significantly less than those controlled by the upper control bit PG_CNTRL<16>.

The next most significant control bit PG_CNTRL<14> of the control word controls buffered version I<14>, which is provided through a series of inverters 505 for buffering the control bit PG_CNTRL<14>. At the output of selected ones of the inverters, another set of inverters controls a set of PMOS transistors 506 which are coupled in parallel, each having its gate coupled to an inverter output, a source coupled to VDD0, and a drain coupled to VDD1. In this manner, when PG_CNTRL<14> is asserted low, each PMOS transistor 506 of each transistor set is turned on to provide a corresponding one of multiple current paths between VDD1 and VDD0. When PG_CNTRL<14> is de-asserted high, the PMOS transistors 506 are turned off.

In one embodiment, each set of PMOS transistors 506 includes 64 PMOS transistors coupled in parallel. Each gate block 401 has 2 sets as shown, in which each side block 301 includes 2 gate blocks 401, and in which each of the gating circuits 202-205 includes 4 side blocks for a total of 4,096 PMOS transistors coupled in parallel and controlled by the control bit PG_CNTRL<14>. Each PMOS transistor has a width of about 2 microns, for a total of about 8,192 microns of transistor material controlled by the control bit PG_CNTRL<14>. Thus, each core of the microprocessor 100 is surrounded by a distribution of a number PMOS devices controlled by the control bit PG_CNTRL<14>, although the number is half of those controlled by the control bit PG_CNTRL<15>.

The next most significant control bit PG_CNTRL<13> of the control word controls buffered version I<13>, which is configured in similar manner with a series of inverters 507 and a set of PMOS transistors 508, except that only one set of 64 PMOS transistors 508 are included. In this case, there are a total of 2,048 PMOS transistors 508 coupled in parallel and controlled by the control bit PG_CNTRL<13>. Each PMOS transistor 508 has a width of about 2 microns, for a total of about 4,096 microns of transistor material controlled by the control bit PG_CNTRL<13>. Thus, each core of the microprocessor 100 is surrounded by a distribution of a number PMOS devices controlled by the control bit PG_CNTRL<13>, although the number is half of those controlled by the control bit PG_CNTRL<14>.

The upper or MSB of the control word, or control bit PG_CNTRL<16>, controls activation of almost 200K PMOS transistors 502 within the gating circuits 202-205 distributed around the core 101, for a total of about 400K microns of transistor material. The next control bits PG_CNTRL<15:13> are configured in a binary pattern, in which control bit PG_CNTRL<15> controls about 16,384 microns of transistor material, control bit PG_CNTRL<14> controls about 8,192 microns of transistor material, and control bit PG_CNTRL<13> controls about 4,096 microns of transistor material. In each case for the illustrated embodiment, the control bit is asserted low to turn on the corresponding PMOS transistors and asserted high to turn them off.

Figure 6:
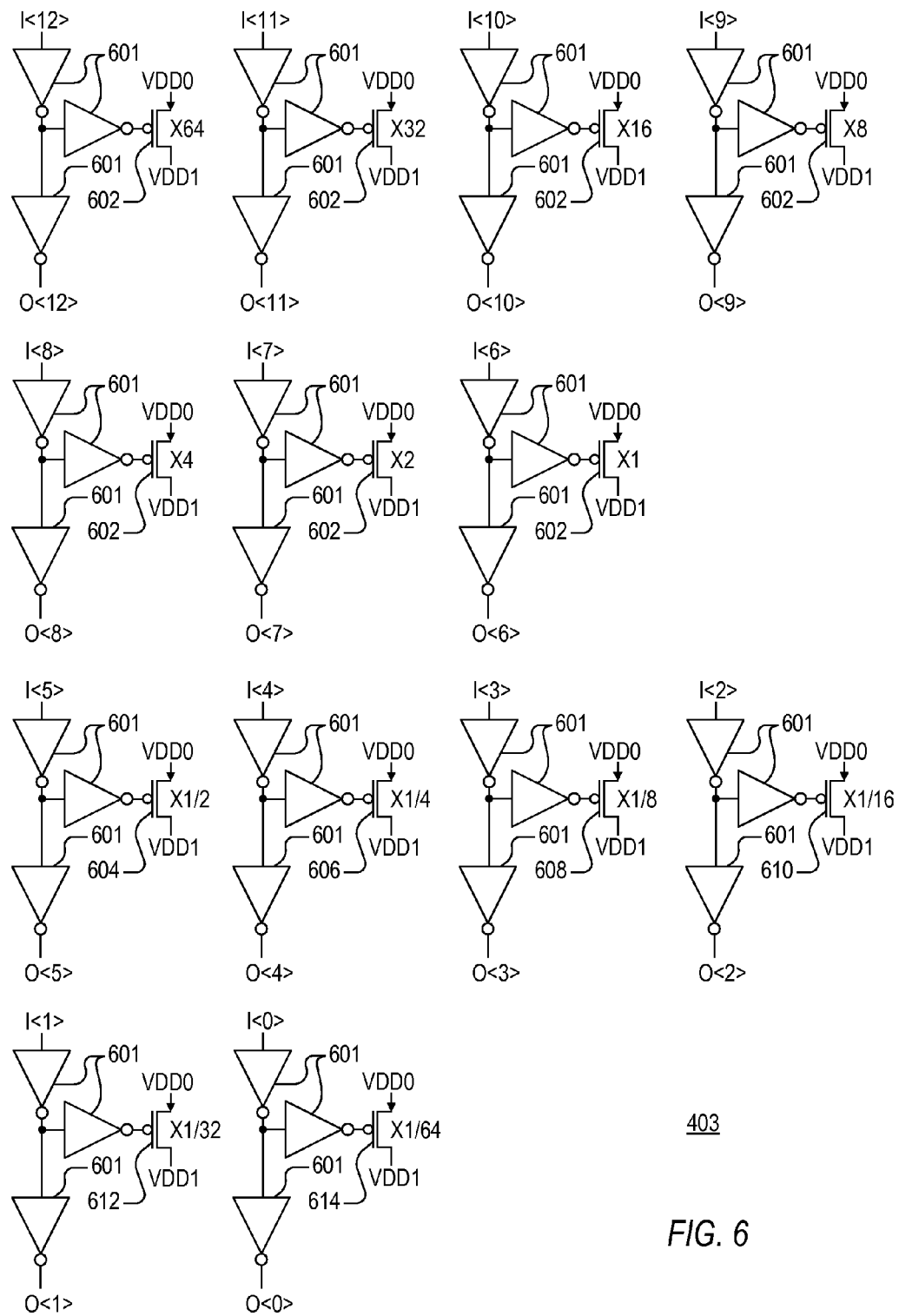
FIG. 6 is a is a schematic diagram of the gate block of FIG. 4 implemented according to one embodiment for lower bits of the control word.

FIG. 6 is a schematic diagram of the gate block 403 implemented according to one embodiment for lower bits of the control word. The gate block 403 continues the binary pattern (of PG_CNTRL<15:0>, other than MSB PG_CNTRL<16>) for the remaining bits PG_CNTRL<12:0>, each successively smaller bit controlling half the number of PMOS transistors and/or half the number of PMOS microns of transistor material as the next higher bit. Again, each PMOS transistor has its gate controlled by the corresponding control bit, its source coupled to VDD0, and its drain coupled to VDD1.

The structure for each of the remaining bits of the control word PG_CNTRL<12:0> for the gate block 403 is substantially similar to the structure for control bit PG_CNTRL<13>, including a series of inverters 601 and a set of PMOS transistors, except that the number and/or the size of each PMOS transistor is adjusted to continue the binary pattern. Each of the inverters 601 is sized according to the amount of transistor material being controlled in each case.

The control bit PG_CNTRL<12> of the control word controls buffered version I<12>, which is configured in similar manner with a series of inverters 601 and a set of 64 PMOS transistors 602. Thus, the structure for the control bit PG_CNTRL<12> is substantially the same as that provided for the control bit PG_CNTRL<13>. In each side block 301, however, there are two gate blocks 401 for every one gate block 403, so that control bit PG_CNTRL<12> controls half the total number of PMOS transistors as the control bit PG_CNTRL<13> to continue the binary progression. The structure for each of the following control bits PG_CNTRL<11:6> is substantially similar, except that each successive bit controls half the number of similarly-sized PMOS transistors. As shown, the buffered control bit I<11> controls 32 PMOS transistors 602, the buffered control bit I<10> controls 16 PMOS transistors 602, the buffered control bit I<9> controls 8 PMOS transistors 602, the buffered control bit I<8> controls 4 PMOS transistors 602, the buffered control bit I<7> controls 2 PMOS transistors 602, and the buffered control bit I<6> controls 1 PMOS transistor 602.

The next control bit I<5> controls only ½ of a PMOS transistor, relatively speaking, shown as a PMOS transistor 604. In one embodiment, the transistor 604 has about one-half the width of the transistors 602 for half the effective microns of transistor material. The next control bit I<4> controls only ¼ of a PMOS transistor, relatively speaking, shown as a PMOS transistor 606. In one embodiment, the transistor 606 has about one-half the width of the transistor 604 for half the effective microns of transistor material. The next control bit I<3> controls only ⅛ of a PMOS transistor, relatively speaking, shown as a PMOS transistor 608. In one embodiment, the transistor 608 has about one-half the width of the transistor 606 for half the effective microns of transistor material. The remaining control bits I<2:0> each control only 1/16, 1/32 and 1/64 of a PMOS transistor, relatively speaking, shown as PMOS transistors 610, 612, and 614, respectively. Although the width could be halved for each successive transistor, instead the length is doubled for a similar result. Thus, the PMOS transistors 610, 612, and 614 have about the same width as the PMOS transistor 608, except that the length of PMOS transistor 610 is doubled, the length of PMOS transistor 612 is quadrupled, and the length of PMOS transistor 614 is 8X that of the PMOS transistor 608.

In this manner, the control bit PG_CNTRL<12> controls 2,048 microns of transistor material, the control bit PG_CNTRL<11> controls 1,024 microns of transistor material, the control bit PG_CNTRL<10> controls 512 microns of transistor material, the control bit PG_CNTRL<9> controls 256 microns of transistor material, the control bit PG_CNTRL<8> controls 128 microns of transistor material, the control bit PG_CNTRL<7> controls 64 microns of transistor material, the control bit PG_CNTRL<6> controls 32 microns of transistor material, the control bit PG_CNTRL<5> controls 16 microns of transistor material, the control bit PG_CNTRL<4> controls 8 microns of transistor material, the control bit PG_CNTRL<3> controls 4 microns of transistor material, the control bit PG_CNTRL<2> controls 2 microns of transistor material, the control bit PG_CNTRL<1> controls 1 micron of transistor material, and the control bit PG_CNTRL<0> controls ½ microns of transistor material.

In the illustrated embodiment, the size of the PMOS transistors in each branch may be the same down to the control bit PG_CNTRL<6> in which only a single PMOS transistor of the same size is included in each set. Thereafter, the width to length ratio (W/L) of the PMOS transistors are adjusted to reduced the transistor material to maintain the binary pattern. For the next control bit PG_CNTRL<5>, the width is decreased by half, and by half again for each of the control bits PG_CNTRL<4> and PG_CNTRL<3>. Thereafter for remaining bits 2 down to 0, the length parameter is varied to complete the binary pattern.

It is noted that the particular organization and binarily distributed pattern of the control bits and PMOS devices is exemplary only in which many variations are possible and contemplated. In general, a multitude of devices are distributed about the core, coupled between VDD0 and VDD1, and turned on or off to digitally alter the effective size of the current path between the supply voltages for power gating, which in turn changes the voltage level of VDD1 relative to VDD0 in a digitally controlled manner. In one embodiment, the final target level for VDD1 during power gating is sufficient to retain core information while reducing leakage current.

Referring back to FIG. 2, during normal operation, the PG control system 201 asserts the control word PG_CNTRL to a default value to effectively clamp VDD1 to VDD0. In one embodiment, the control bits PG_CNTRL<16,11:0> are asserted low to activate the corresponding PMOS transistors whereas the remaining control bits PG_CNTRL <15:12> are asserted high, or PG_CNTRL<16:0> has an initial value of 01111000000000000b (in which appended "b" denotes a binary value). As previously described, the power controller 110 may wait for the core 101 to be idle or command it to be idle, and then it turns off the functional clock(s) of the core 101 and asserts PGATE1 to power gate the core 101. When the PGATE1 signal is received to initiate power gating, the upper control bit PG_CNTRL<16> is turned off (pulled high) to turn off the majority of the PMOS transistor devices (e.g., about 200K). Since the core 101 is idle and drawing only leakage current, the gated source voltage VDD1 may not drop significantly when control bit PG_CNTRL<16> turns off most of the transistor material between VDD0 and VDD1. At this point in time, only the control bits PG_CNTRL<11:0> remain on for a total of about 4,096 microns of transistor material which is sufficient to maintain the supply voltage VDD1 sufficiently close to VDD0. It is noted that the impedance, and thus the resistance, between VDD0 and VDD1 for the power gated core is increased by a significant amount and that there may be some voltage variation between VDD0 and VDD1.

The PG control system 201 then begins digitally controlling the remaining bits of the control word PG_CNTRL<11:0> to reduce the gated supply voltage VDD1 to the target voltage level as further described herein. With each successive step, the resistance between VDD0 and VDD1 is increased thereby reducing the voltage level of VDD1 until the target voltage level is achieved. As previously described, the target voltage level reduces the leakage current by a substantial amount yet remains sufficient to maintain the state of the core 101 prior to power gating.

The structure of the distributed PMOS devices around each core of the microprocessor 100 and the control of selected numbers by each bit of the control word PG_CNTRL enables digitally controlled power gating as controlled by each of the power gating systems 105-108 (as shown in FIG. 1). In a simple digital control scheme according to one embodiment, a fixed digital adjustment value may be subtracted from the corresponding control word PG_CNTRL in fixed intervals of time to achieve the target voltage level. The gated voltage level VDD1 generally follows the value of the control word PG_CNTRL, so that the gated voltage level decreases as the control word decreases. When the target voltage level is achieved as determined by comparing the level of VDD1_FB with PG_VREF_L, the control word PG_CNTRL may remain at about the same value during the power gating period. It is noted, however, that in the illustrated embodiment, the control word PG_CNTRL may be continuously toggled at the frequency of the operative clock value and is responsive to any further adjustments of the gated voltage level.

As the PMOS devices are turned off, however, the resistance between VDD0 and the gated supply voltage VDD1 increases (whereas capacitance remains substantially the same) thereby increasing the time constant for response to adjustments. In this manner, stabilization of voltage change of VDD1 takes longer with each new adjustment. If the adjustment value is too high or the fixed interval of time too short, then there may exist the potential of undershooting the target voltage level. An undershoot of the target voltage means that the gated voltage to the core 101 might dip below the voltage level necessary to sustain the core state information, which is not desired when the core information is intended to be sustained during power gating. Thus, the adjustment value is made sufficiently small and/or the fixed time interval sufficiently long to avoid undershooting the target voltage level.

In another embodiment, the adjustment value is made proportional to the control value. In this manner, as the control value is decreased, the adjustment value is decreased by a proportional amount for a fixed adjustment "gain." In this manner, the adjustment is initially larger to adjust the control value more quickly at first, and then proportionately decreases as the control value decreases. The gated supply voltage VDD1 is adjusted in similar manner in response to the changes of the control value. In a digital embodiment as described herein, a proportional adjustment may be determined by right-shifting the digital control word to obtain the adjustment value, which is then subtracted from the control word to decrease it by a proportional amount. As an example, the control word may be shifted by 6 places to provide an adjustment value which is 1/64th of the control word, which is then subtracted from the control word to decrease it by a proportional amount.

In another embodiment, the adjustment period may be adjusted continuously or periodically. In one embodiment, the period of the power gating clock used for determining adjustment timing may be increased to increase the adjustment period so that the adjustments occur less frequently as the target voltage is approached. In one embodiment, a clock with a known period is developed and used to generate a plurality of clock signals, each with a different period. As adjustments are made, different clock signals are selected to change the periods of adjustment. In another embodiment, the frequency of the clock signal may be adjusted using controlled oscillators or the like. In another embodiment, cycles of the clock may be skipped to change (e.g., increase) the adjustment period over time.

In further embodiments, a combination of methods are used, such as both changing the adjustment value and changing the adjustment period over time during onset and exiting of power gating.

The modifications of the adjustment value and/or the adjustment period may be predetermined and configured to provide a fixed voltage adjustment curve during onset or exit of power gating. In other embodiments, the modifications of the adjustment value and/or the adjustment period are made dynamically based on one or more monitored inputs. In one embodiment, the gated supply voltage VDD1 is monitored and compared to one or more threshold voltage levels (e.g., as indicated by reference voltages PG_VREF<1:N>) and adjustments are made based on the gated voltage level meeting the threshold voltage levels. In another embodiment, the control word itself is used to determine the modifications of the adjustment value and/or the adjustment period, such as achievement of certain predetermined control word values. For example, the initial control word may be when bits PG_CNTRL<11:0> are all turned on activating the corresponding PMOS transistors. As each highest activated bit of PG_CNTRL<11:0> transitions off, the adjustment value and/or the adjustment period may be further modified.

In another embodiment, both threshold voltage levels and control word threshold values are monitored to determine modifications of the adjustment value and/or the adjustment period. The present disclosure provides flexibility for many variations of digital control of power gating.

Figure 7:
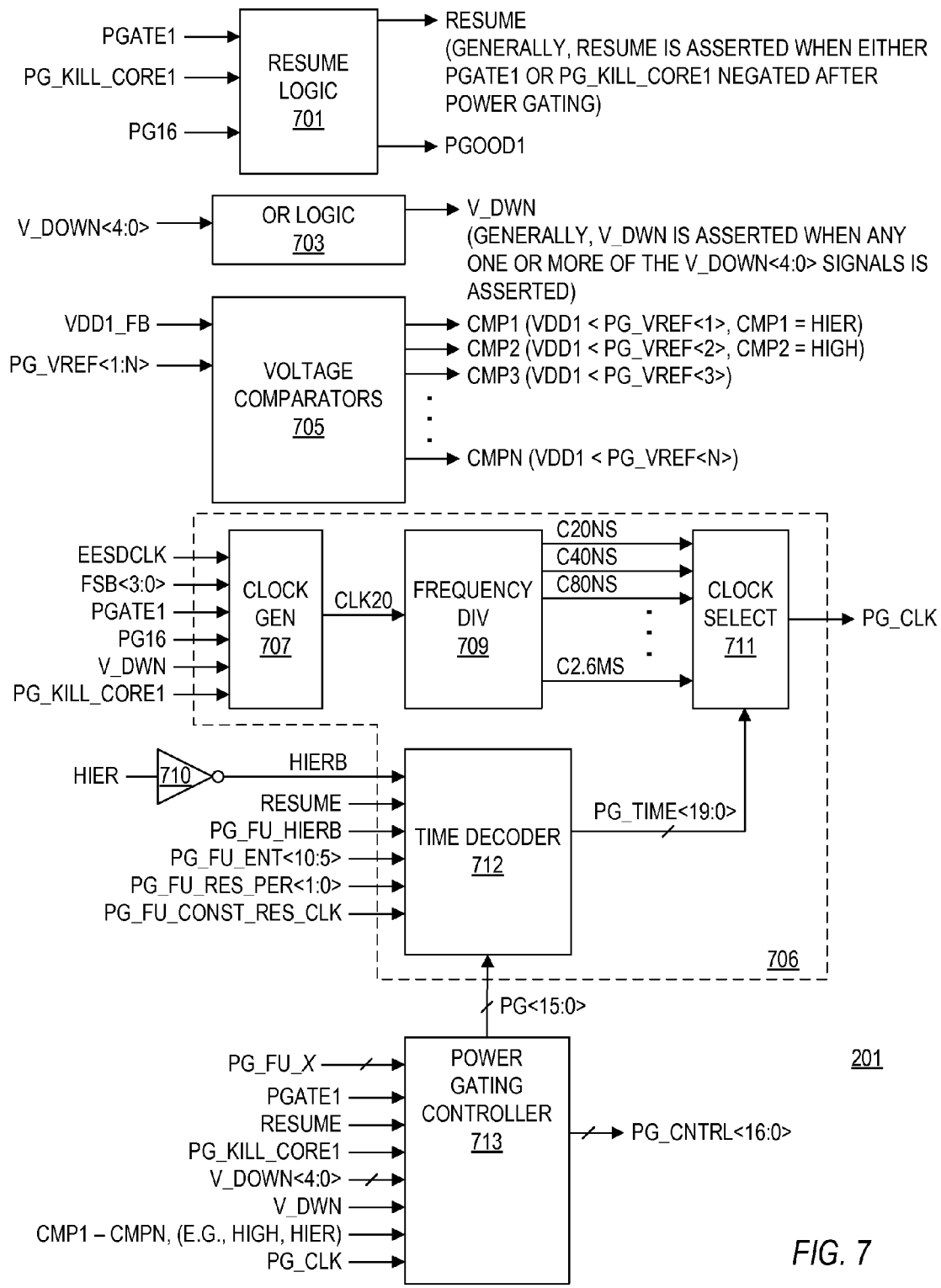
FIG. 7 is a block diagram of the PG control system of FIG. 2 implemented according to one embodiment of the present invention.

FIG. 7 is a block diagram of the PG control system 201 implemented according to one embodiment of the present invention. In general, the PG control system 201 incorporates a digital adjuster that digitally adjusts the control word PG_CNTRL to control the voltage level of the gated supply bus 206 providing the gated supply voltage VDD1. Digital adjustment may be made incrementally by adding or subtracting a digital adjustment value during power gating (full or partial) or power resumption (e.g., incremental control word adjuster 801 of FIG. 8), or may be made globally (e.g., global control word adjuster 803 of FIG. 8) by adding a larger digital adjustment in the event of a global voltage shift (pending change of global supply voltage VDD0). The size of the digital adjustment value may depend on gating status (gating operations or resuming operations), the voltage level of VDD1, and on the control word itself. The rate of adjustment during sequential adjustment periods may be determined by the period of PG_CLK, which may also depend on gating status (gating operations or resuming operations), the voltage level of VDD1, and on the control word itself. The PG control system 201 is illustrated in simplified form to illustrate relevant functional operation and without departing from the spirit and scope of the present invention. In certain specific configurations, for example, many of the control signals may have multiple versions including those synchronized with applicable clock signals or the like. The specific details of multiple versions of the various control signals based on synchronization and the like are not shown or described herein since they are not necessary for a full and complete understanding of the present invention.

The PG control system 201 includes resume logic 701 receiving the PG_KILL_CORE1 and PGATE1 signals and providing the RESUME signal. In general, PGATE1 is asserted by the power controller 110 for partial power gating to cause the power gating circuit 105 to reduce the voltage level of VDD1 to a target voltage level, such as a state retention voltage level. The predetermined target voltage level may be any suitable voltage level to achieve a desired purpose. One method for the power controller 110 to control the target voltage level is to select or otherwise program one or more of the reference voltages PG_VREF<1:N> to control the power gating process. One such voltage level is a state retention level (as indicated by assertion of HIGH) that significantly reduces sub-threshold leakage current to reduce power consumption during a low power state. The state retention voltage level is sufficiently high to ensure data retention or otherwise to maintain the state of core 101 of the microprocessor 100. When PGATE1 is subsequently negated, the resume logic 701 asserts RESUME to exit power gating and initiate the resume process to increase the voltage level of VDD1 back to the voltage level of VDD0.

The power controller 110 asserts PG_KILL_CORE1 for full power gating of the core 101, in which the power gating circuit 105 reduces the voltage level of VDD1 to about the same voltage level as VSS0 (or ground). Full power gating maximizes the reduction of power consumption at the expense of losing the state of the core 101 and any latency required to restore the state of the core 101. In one embodiment, assertion of PG_KILL_CORE1 forces negation (or de-assertion) of all of the bits of PG_CNTRL<16:0> to turn off all of the PMOS devices to isolate the core 101 from the supply voltage VDD0. In one embodiment, assertion of PG_KILL_CORE1 also forces assertion of an internal version of the PGATE1 signal, although PG_KILL_CORE1 overrides power gating operation. When PG_KILL_CORE1 is subsequently negated, the internal version of the PGATE1 signal is negated as well forcing assertion of RESUME to initiate the resume operation from full power gating.

The resume logic 701 is shown further receiving a signal PG16, which is essentially the same signal as (or otherwise derived from) the MSB of the control word, or PG_CNTRL<16>, and provides the power good signal PGOOD1. The resumption process is completed when PG16 is asserted low, and the resume logic 701 responds by asserting PGOOD1 high to inform the power controller 110 that the resumption process is completed.

The PG control system 201 includes OR logic 703 receiving the V_DOWN<4:0> signals and providing a signal V_DWN. In general, V_DWN is asserted when any one or more of the V_DOWN<4:0> signals is asserted indicating that the voltage level of VDD0 is being reduced, such as for a lower power mode.

The PG control system 201 includes a set of voltage comparators 705 for comparing the voltage level of VDD1_FB with each of the reference voltages PG_VREF<1:N> and providing a corresponding set of compare signals CMP1, CMP2, ..., CMPN (CMP1-CMPN). The compare signals are normally negated high and asserted low when the compare condition is met. Each voltage comparator (not shown) may be implemented in any suitable manner, such as a sense amplifier or the like. As previously described, VDD1_FB is a feedback version of VDD1. Each compare signal CMP1-CMPN is asserted low when VDD1 drops below the corresponding reference voltage, so that CMP1 is asserted low when VDD1<PG_VREF<1>, CMP2 is asserted low when VDD1<PG_VREF<2>, and so on up to CMPN being asserted low when VDD1<PG_VREF<N>. In one embodiment, PG_VREF<1> is the same as a signal PG_VREF_H indicating a voltage above the state retention voltage level, and a signal HIER is asserted low when VDD1<PG_VREF_H. Also, PG_VREF<2> is the same as a signal PG_VREF_L indicating the state retention voltage level, and a threshold signal HIGH is asserted low when VDD1<PG_VREF_L. It is appreciated that any number of reference voltages or threshold voltage levels may be defined for comparing corresponding voltage levels of VDD1 during power gating.

The PG control system 201 further includes a clock controller 706 used for controlling timing of periodic adjustments during digital power gating. In one embodiment, the clock controller 706 includes a clock generator, a frequency divider 709, a clock select block 711 and a time decoder 712. In the illustrated embodiment, the clock signal EESDCLK and the value FSB<3:0> are provided to the clock generator 707 which outputs a clock signal CLK20. The EESDCLK clock signal may be received from an external source or may be generated locally on the microprocessor 100. The FSB<3:0> indicates the frequency of a bus clock of the microprocessor system. In the illustrated embodiment, EESDCLK is generated at one of a set of known frequencies, and the clock generator 707 uses EESDCLK and FSB<3:0> to generate CLK20 with a known period of about 20 nano-seconds (ns). It is understood that the particular known period of 20 ns is arbitrary and that any suitable known period may be employed in any given implementation.

CLK20 is provided to the frequency divider 709, which develops an array of clock signals C20NS, C40NS, ..., C2.6MS with corresponding clock periods used for the power gating functions. In general, the frequency divider 709 multiplies the period (20 ns) of CLK20 by factors of ($2^0$, $2^1$, $2^2$, $2^3$, ..., $2^{17}$) to develop respective clock signals with periods of 20 ns, 40 ns, 80 ns, 160 ns, ..., 2.6 milliseconds (ms) to provide the C20NS, C40NS, ..., C2.6MS clock signals, respectively, in which C2.6MS has a period of about 2.6 milliseconds (ms). It is noted that only 18 clock factors are defined of the 20 possible control bits in the illustrated embodiment. This allows for the same clock frequency to be assigned to multiple control bits if desired. In one embodiment, the frequency divider 709 includes a set of series-coupled toggle flip-flops or toggle registers or the like (not shown), each subsequent latch doubling the clock period of a clock provided from a prior latch. The C20NS, C40NS, ..., C2.6MS clock signals are provided to the clock select block 711 which selects one of the input clock signals based on a 20-bit time value PG_TIME<19:0> as the PG_CLK signal at its output. Only one of the bits of the PG_TIME<19:0> value is asserted at a time to select a corresponding clock signal with corresponding clock period. The clock select block 711 may incorporate one or more multiplexers or the like or other select logic (e.g., NAND/NOR logic).

The PG_CLK signal has a period selected from periods of 20 ns, 40 ns, 80 ns, 160 ns, ..., 2.6 ms based on the PG_TIME<19:0> value. In one embodiment, only one of the bits of the PG_TIME<19:0> value (a clock select bit) is asserted at a time to select one of 20 clock signals with the desired period as PG_CLK. In one embodiment, the lower the select bit of the PG_TIME<19:0> value (the closest to the right-most bit), the lower the period of PG_CLK (and thus the higher the frequency). As the clock select bit is moved to the left, the greater the period of PG_CLK. In other words, the least significant bit of the PG_TIME<19:0> value corresponds with the lowest clock period (fastest clock) whereas the most signification bit corresponds with the highest clock period (slowest clock). As described further herein, the clock period determines the timing of adjustments during power gating and resume operations.

The clock generator 707 may further receive the PGATE1, V_DWN, PG16 and PG_KILL_CORE1 signals for controlling operation of PG_CLK. In alternative embodiments, any one or more of these signals may be provided, in additional or in the alternative, to the frequency divider 709 and/or the clock select block 711 for performing similar functions. During normal operation when PGATE1 is not asserted, PG_CLK is not operative and is held to a steady state value, such as a steady logic low or logic zero. When PGATE1 is asserted to initiate power gating, PG16 is negated (or pulled high) to turn off associated PMOS devices and PG_CLK is activated at a selected frequency. When PGATE1 is negated, the resume logic 701 asserts RESUME to return VDD1 to its normal operating voltage level. When the resumption process is completed, PG16 is re-asserted low, which also suspends operation of PG_CLK.

When V_DWN is asserted during power gating, PG_CLK is temporarily suspended to its steady state value until after voltage adjustment, and is re-started when V_DWN is subsequently negated. PG_KILL_CORE1 overrides the power gating function to isolate the core 101 from VDD0 by turning off the PMOS devices coupled between VDD0 and VDD1. Assertion of PG_KILL_CORE1 also turns off operation of PG_CLK (so that it is asserted to its steady state value). When PG_KILL_CORE1 is subsequently negated, PG_CLK is restarted and the resume operation is initiated to return VDD1 to its normal operating voltage level.

The time decoder 712 receives a control word value PG<15:0> (described further herein), an inverted version of HIER, or HIERB (provided at the output of an inverted 710 receiving HIER at its input), the RESUME signal, and several fused (or scanned) parameters (e.g., PU_FU_HIERB, PG_FU_ENT<10:5>, PG_FU_RES_PER<1:0>, PG_FU_CONST_RES_CLK) to select a clock period of PG_CLK between 20 ns and 2.6 ms by asserting a corresponding bit of the PG_TIME<19:0> time value. The period of PG_CLK determines the adjustment period of the control word PG_CNTRL<16:0> during power gating and when exiting power gating to resume operations.

The period of PG_CLK may be adjusted based on the control word itself. As previously described, during power gating, the upper bit PG_CNTRL<16> is negated (or asserted high) to turn off most of the PMOS transistors, whereas bits PG_CNTRL<11:0> are initially asserted (or asserted low). An initial period of PG_CLK is selected and a subtract value is selected for decreasing the control word during successive cycles of PG_CLK. When the control word decreases to predetermined values as programmed into the time decoder 712, the period of PG_CLK may be adjusted to slow the adjustment periods accordingly. For example, when bit PG_CNTRL<11> goes high (negated), the period of PG_CLK may be doubled. When bit PG_CNTRL<10> goes high (negated), the period of PG_CLK may again be doubled, and so on. Thus, the control word itself may be used to adjust the period of PG_CLK. Any selected value of the control word may be programmed to select a corresponding clock period.

HIER indicates VDD1 crossing a predetermined threshold voltage value that may be used to adjust the period of PG_CLK. For example, when HIER is asserted low indicating that VDD1 has reached the upper threshold voltage level, the clock period of PG_CLK may be increased as the voltage level of VDD1 nears the target voltage level indicated by HIGH for data and state retention of the core 101. In a particular embodiment, for example, VDD1 decreases from about 1.05V down to the target voltage level of 450 mV, where HIER is set to about 550 mV. HIGH may be set to indicate the target voltage level of 450 mV. Thus, when VDD1 reaches the threshold voltage level of 550 mV indicated by assertion of HIER, the period of PG_CLK is adjusted to slow the frequency of adjustments to reduce the possibility of undershoot. In one embodiment, the period of PG_CLK is quadrupled upon reaching the HIER threshold.

It is noted that any number of threshold voltages may be defined for adjusting the period of PG_CLK. For example, the period of PG_CLK may be doubled for each 100 mV drop of VDD1.

When the RESUME signal is asserted to exit power gating, the period of PG_CLK may be further adjusted. For example, the period of PG_CLK may be reduced to speed up the return to the normal operating range of VDD1 when RESUME is asserted. For example, when RESUME is asserted, selected add values are added to the control word value PG<15:0> to update the control word PG_CNTRL<16:0> accordingly. It is noted, however, that the adjustment should not be too quick since it might otherwise cause an inrush of current or a current pulse to the core 101 that may affect the operation of any one or more of the surrounding cores 102-104 due to charge sharing. Thus, powering up the core 101 too quickly may result in a dip of VDD0 which may negatively impact other cores or surrounding circuitry.

Figure 11:
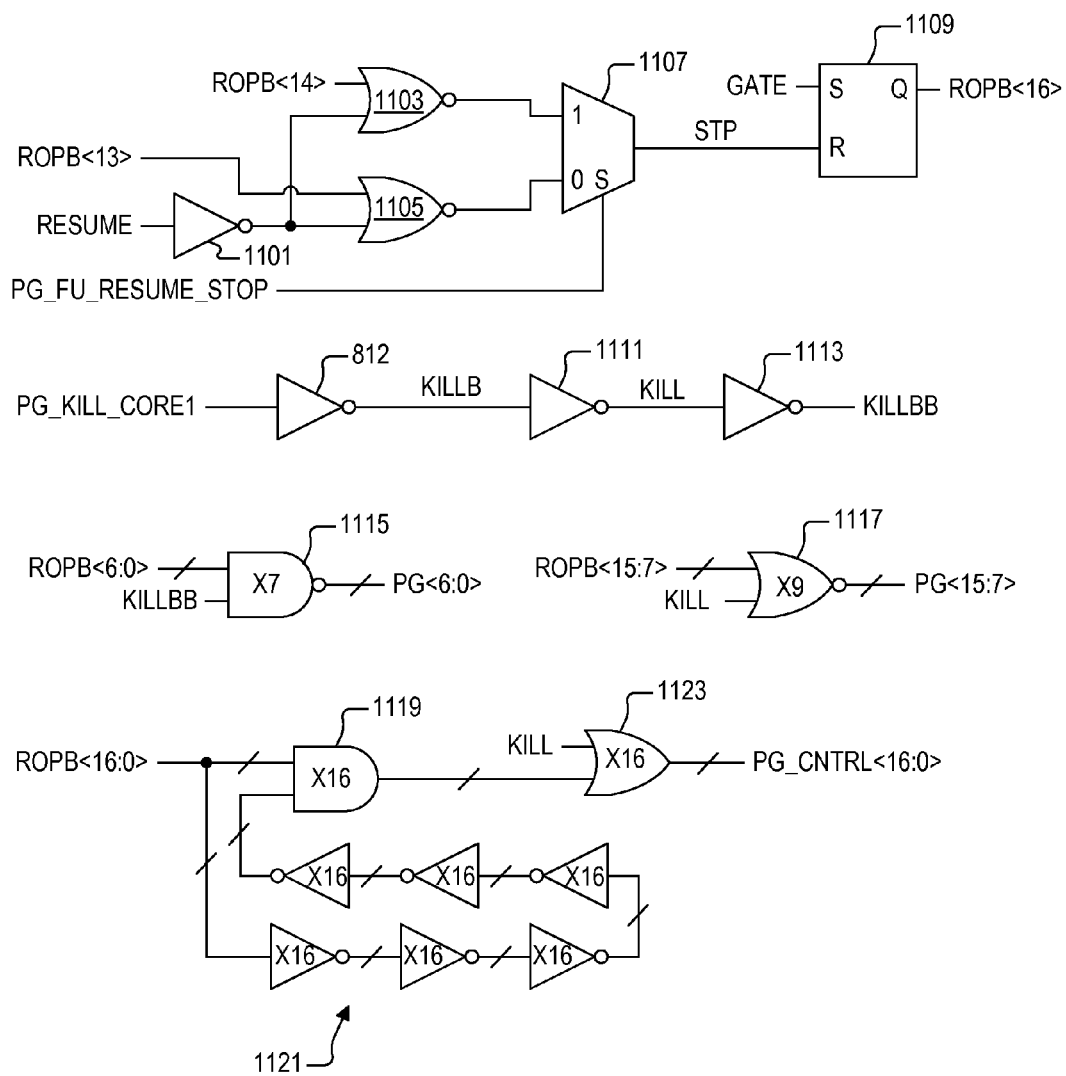
FIG. 11 is a simplified schematic diagram of the control word logic of FIG. 8 implemented according to one embodiment.

The PG control system 201 further includes a power gating controller 713 for developing the control word PG_CNTRL<16:0> and PG<15:0>, described further with reference to FIG. 11, which is generally an inverted version of the lower 16 bits of the control word PG_CNTRL<16:0>. The power gating controller 713 receives signals PG_FU_X, PGATE1, RESUME, PG_KILL_CORE1, V_DOWN<4:0>, V_DWN, CMP1-CMPN (including HIGH and HIER in the illustrated embodiment), and PG_CLK. As previously described, PG_FU_X includes fuse or scan values PG_FU_ADD_GN, PG_FU_SUB_GN, PG_FU_HIERB, PG_FU_ENT<10:5>, PG_FU_RESUME_GN<1:0>, PG_FU_RES_PER<1:0>, PG_FU_CONST_RES_CLK and PG_FU_RESUME_STOP for adjusting the power gating process as further described herein.

Figure 8:
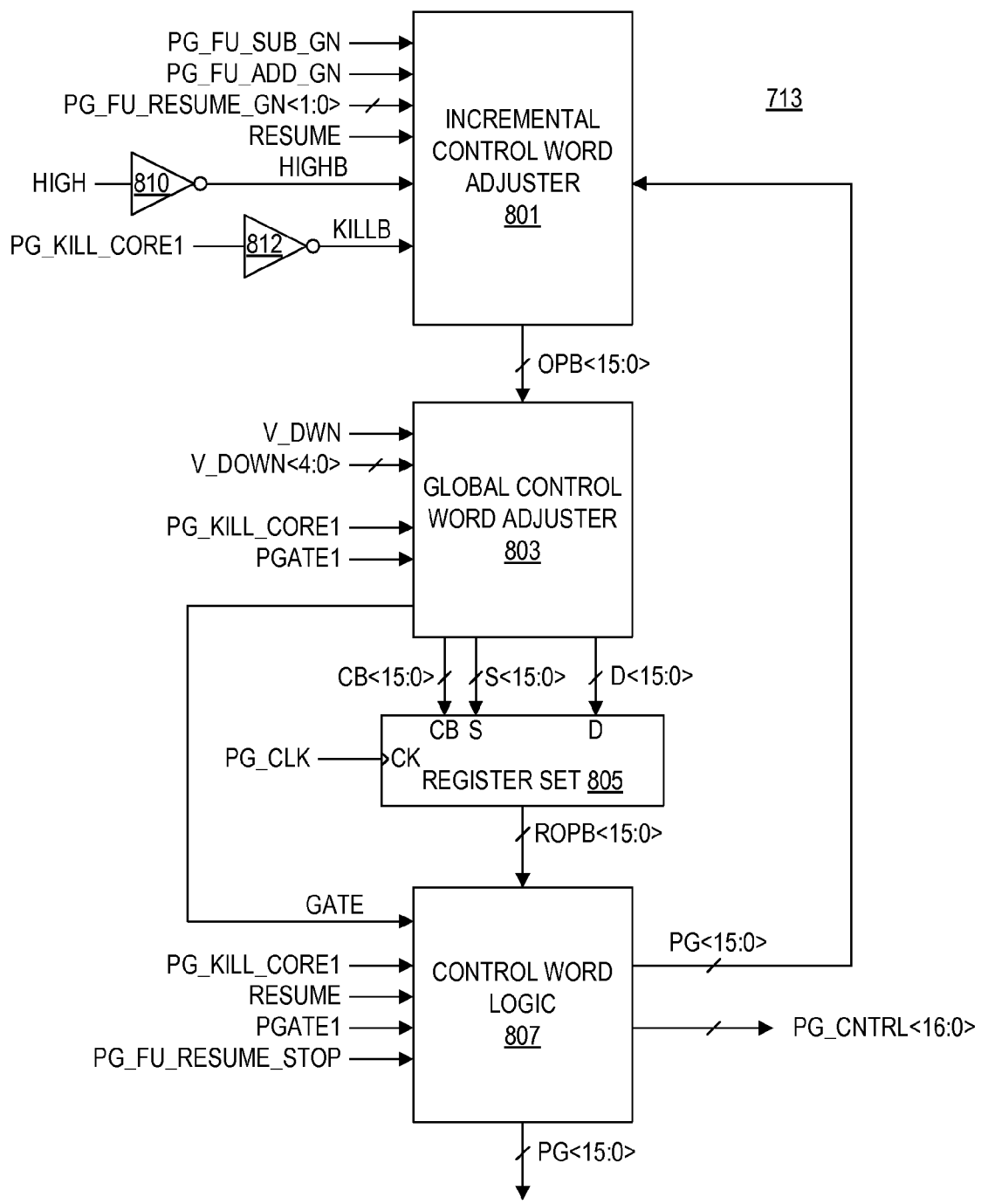
FIG. 8 is a block diagram of the power gating controller of FIG. 7 implemented according to one embodiment of the present invention.

FIG. 8 is a block diagram of the power gating controller 713 implemented according to one embodiment of the present invention. The power gating controller 713 generally includes the incremental control word adjuster 801, the global control word adjuster 803, a register set 805 (or set of registers, each for a corresponding one bit of the lower 16 bits of the control word), and control word logic 807. The incremental control word adjuster 801 receives PG<15:0> from the control word logic 807, and either adds or subtracts an adjustment value to form an adjusted control word value OPB<15:0> at its output. The MSB of the control word PG_CNTRL<16> is determined in the control word logic 807 as further described below.

The adjustment value is either an add value or a subtract value depending upon whether it is desired to increase or decrease the control word PG_CNTRL<16:0>. It is noted that the bits of the control word PG_CNTRL<16:0> are inverted in the illustrated embodiment since controlling P-channel (e.g., PMOS) transistor devices, in which increasing and decreasing the control word generally refers to its magnitude. The control word is decreased for power gating, such as in response to assertion of PGATE1, or negated entirely, such as in response to assertion of PG_KILL_CORE1, to reduce the voltage of the gated supply voltage VDD1. The control word is increased to increase the voltage of VDD1, such as in response to the RESUME signal to resume normal operation. In one embodiment, the add value and the subtract value are both determined proportional to the current value of the control word, such as the equivalent of right-shifting the control word a predetermined number of times "y" to divide the control word by 2Y to determine the adjustment value. The PG_FU_SUB_GN value may be used to change or adjust the number of right-shifts "y" to further adjust the gain of adjustment during power gating. The add value may be determined in a similar manner, in which the PG_FU_ADD_GN may be used to adjust the add value.

The HIGH threshold signal is inverted by an inverter 810 to provide an inverted threshold signal HIGHB, and the PG_KILL_CORE1 signal is inverted by another inverter 812 to provided an inverted kill signal KILLB, in which both signals along with the RESUME signal are provided to the incremental control word adjuster 801. A signal name appended with a "B" typically denotes an inverted version of the signal, unless otherwise specified. The HIGHB, KILLB and RESUME signals are collectively used to select one of the add or subtract values for increasing or decreasing the control word. For example, during power gating, the subtract value is selected to reduce the control word and VDD1. When the target voltage level for VDD1 is reached, both HIGH and HIGHB transition to opposite states and the add value is selected to increase the control word and VDD1. When VDD1 goes back above the target value, HIGH and HIGHB switch again and the subtract value is selected once again. Operation may repeat or toggle in this manner until RESUME is asserted. During the toggling of HIGH at the data retention level, the add value may be greater than the subtract value to reduce the frequency of oscillation. When the RESUME signal is next asserted, the add value is selected to increase the voltage of VDD1 back to the normal operating level. KILLB indicates that full power gating is desired in which case the HIGHB signal is bypassed or otherwise ignored.

The adjusted control word OPB<15:0> is provided to the global control word adjuster 803, which performs a one-time adjustment of the control word when one of the V_DOWN<4:0> signals is asserted as indicated by V_DWN. When used, the global adjustment increases the magnitude of the control word during power gating when VDD0 is scheduled to decrease which might otherwise cause VDD1 to undershoot the target voltage level by an amount that might jeopardize loss of state of the core 101. When one of the V_DOWN<4:0> signals is asserted, the signal V_DWN is also asserted and the global control word adjuster 803 adjusts the control word based on which particular one of the V_DOWN<4:0> signals is asserted, as further described herein.

In the illustrated embodiment, the global control word adjuster 803 outputs three different control word values, including an inverted clear value CB<15:0>, a set value S<15:0>, and a data value D<15:0>, provided to inverted clear (CB), set (S) and data (D) inputs, respectively, of the register set 805. The inverted clear value CB<15:0> and the set value S<15:0> are used as asynchronous inputs to the register set 805 during initialization and during global control word adjustment when PG_CLK is not operating. The data value D<15:0> is used as the synchronous data input when PG_CLK is operative. The global control word adjuster 803 further uses PG_KILL_CORE1 and PGATE1 to develop a signal GATE and an inverted version thereof, or GATEB, in which GATE is provided to an input of the control word logic 807. The GATE and GATEB signals are used to develop an initial control word as further described herein.

The register set 805 receives PG_CLK and outputs a "registered" version of the adjusted control word (globally adjusted or not), shown as ROPB<15:0>, to the control word logic 807. ROPB<15:0> is asynchronously set to an initial value. ROPB<15:0> is asynchronously updated during global adjustment using the CB<15:0> and S<15:0> values while PG_CLK is suspended. ROPB<15:0> is updated synchronously with PG_CLK using D<15:0> during power gating and resume operations.

The control word logic 807 includes logic to convert ROPB<15:0> into the lower bits of the control word, or PG_CNTRL<15:0>. The control word logic 807 includes logic responsive to the PG_KILL_CORE1, RESUME, PGATE1 and PG_FU_RESUME_STOP signals to develop the upper bit of the control word PG_CNTRL<16> (and thus PG16) as further described herein. The control word logic 807 uses ROPB<15:0> and PG_KILL_CORE1 to develop the PG<15:0> value fed back to the incremental control word adjuster 801 and further provided to the time decoder 712.

Figure 9:
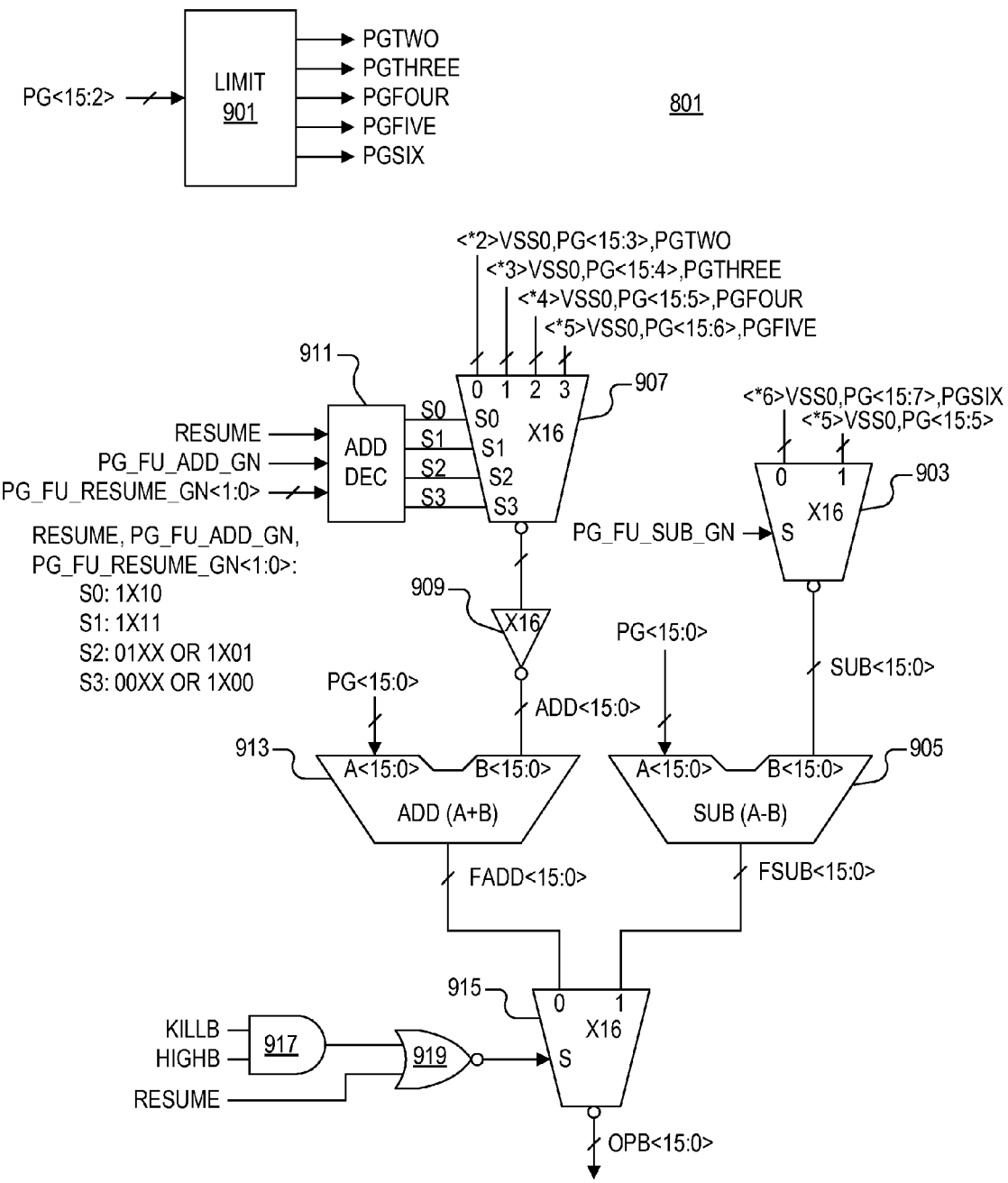
FIG. 9 is a more detailed schematic and block diagram of the incremental control word adjuster of FIG. 8 according to one embodiment.

FIG. 9 is a more detailed schematic and block diagram of the incremental control word adjuster 801 according to one embodiment. The incremental control word adjuster 801 may include a limit circuit 901 that generally operates as a safeguard to prevent an overflow or an underflow. As described further below, the PG<15:0> value is right-shifted a selected number of times to generate an adjustment value. When PG<15:0> reaches a certain low value, further incremental adjustment may cause a larger change of VDD1 than desired. For example, even a small decrement of PG<15:0> at this low level might cause VDD1 to undershoot below the minimum desired voltage level to maintain data retention. In the illustrated embodiment, the limit circuit 901 limits the minimum value of PG<15:0> to 1111111111100000b (e.g., representing an inverted digital value of 31).

The limit circuit 901 receives PG<15:2> and provides multiple limit values PGTWO, PGTHREE, PGFOUR, PGFIVE, and PGSIX. Each limit value is used to replace a least significant bit (LSB) of a shifted value to prevent the shifted value from going below a predetermined minimum level. In one embodiment, the predetermined minimum level corresponds with a digital value of 32. The particular limit value used depends on the number of right-shifts of the shifted value. For example, PGTWO is used for two right-shifts, PGTHREE is used for three right-shifts, PGFOUR is used for four right-shifts, PGFIVE is used for five right-shifts, and PGSIX is used for six right-shifts.

A 2-input multiplexer (MUX) 903 has a "0" input receiving a value <*6>VSS0,PG<15:7>,PGSIX, a "1" input receiving a value <*5>VSS0,PG<15:5>, a select input "S" receiving the PG_FU_SUB_GN signal, and an output providing a subtract value SUB<15:0>. Although the MUX 903 is described as a singular device, it is shown with a notation "X16," which means that it may be implemented as a set of 16 parallel MUXs, each for handling one of the 16 bits at the corresponding inputs and outputs. A similar notation is used for other sets of MUXs, latches, registers, and logic gates as described herein. The notation "<*6>VSS0" denotes 6 logic "0" values forming the left-most bits of the value, which is then followed by the upper 9 bits of PG<15:0>, or PG<15:7>, and which is then followed by the PGSIX value as the LSB of the final value. The <*6>VSS0,PG<15:7>,PGSIX is the equivalent of right-shifting the PG<15:0> value six times while shifting in logic "0" from the left and using the PGSIX value as the LSB of the final value. The final value thus represents $1/64^{th}$ of the value of the control word value PG<15:0> (down to the predetermined limit value). The value <*5>VSS0,PG<15:5> is formed in a similar manner except only right-shifted by 5 bits and without using a limit value. The value <*5>VSS0, PG<15:5> thus represents $1/32^{nd}$ of the control word value PG<15:0>.

The default value of PG_FU_SUB_GN is logic "0" so that the value <*6>VSS0,PG<15:7>,PGSIX is selected as the default value for SUB<15:0> (after being inverted at the output of the MUX 903), representing a gain of $1/64^{th}$ of the value of the control word value PG<15:0> for the subtract adjustment value. When PG_FU_SUB_GN is instead asserted to a logic "1," then the value <*5>VSS0,PG<15:5> is instead selected as the value for SUB<15:0> (after being inverted), representing an increased gain of $1/32^{nd}$ of the value of the control word value PG<15:0> for the subtract adjustment value.

The control word value PG<15:0> is provided to an "A" input of a 16-bit subtractor 905, which receives the subtract value SUB<15:0> at its "B" input. The subtractor 905 subtracts the B input value from A input (A-B) to provide a difference value FSUB<15:0> at its output. In this manner, the difference value FSUB<15:0> represents a reduction in magnitude of $1/64^{th}$ or $1/32^{nd}$ of the control word value PG<15:0> depending upon the value of the subtract gain value PG_FU_SUB_GN.

The add gain is determined in a similar manner, but with a greater number of add gain selections for power gating and resume operations. A 4-input MUX 907 receives four gain values <*2>VSS0,PG<15:3>,PGTWO, <*3>VSS0,PG<15:4>,PGTHREE, <*4>VSS0,PG<15:5>,PGFOUR, and <*5>VSS0,PG<15:6>,PGFIVE, at inputs "0," "1," "2," and "3," respectively, representing add gains of $1/4^{th}$, $1/8^{th}$, $1/16^{th}$, and $1/32^{nd}$, respectively, each with a corresponding LSB limit value. The output bits of the MUX 907 are inverted and then inverted again by a set of inverters 909 to provide an add value ADD<15:0>. In a similar manner as the MUX 903, the MUX 907 includes notation "X16" meaning that it may also be implemented as a set of 16 parallel MUXs. Similarly, the set of inverters 909 has notation "X16" indicating a set of 16 parallel inverters. An ADD decoder 911 is provided for selecting one of the gain values based on the signals RESUME, PG_FU_ADD_GN, and PG_FU_RESUME_GN<1:0>. The ADD decoder 911 asserts one of output signals S0, S1, S2 or S3 to corresponding inputs of the MUX 907, for selecting a corresponding one of the add values provided at the respective inputs 0," "1," "2," and "3," respectively.

The RESUME, PG_FU_ADD_GN, and PG_FU_RESUME_GN<1:0> signals form 4 bits for asserting one of the S0-S3 signals for selecting the add gain. The PG_FU_RESUME_GN<1:0> bits are only applicable during resume when RESUME is asserted to a logic "1." The PG_FU_ADD_GN value is only applicable when RESUME is negated to a logic "0" such as during power gating.

When RESUME and PG_FU_ADD_GN are both logic "0" so that the PG_FU_RESUME_GN<1:0> bits are don't care "XX," then the four bit value is "00XX" such that the add decoder 911 asserts S3 to select the add gain <*5>VSS0, PG<15:6>,PGFIVE or $1/32^{nd}$ gain as the default value for the add value for power gating. When RESUME is logic "0" and PG_FU_ADD_GN is logic "1," then the four bit value is "01XX" such that the add decoder 911 asserts S2 to select the add gain <*4>VSS0,PG<15:5>,PGFOUR for an increased add gain of $1/16^{th}$ during power gating.

When RESUME is logic "1" for resume operations, then the PG_FU_RESUME_GN<1:0> bits determine the add value gain for resume operations. In this case, PG_FU_RESUME_GN<1:0> bits of "00," "01," "10," and "11" cause the add decoder 911 to assert the signals S3, S2, S0 and S1, respectively, to select the gain values <*5>VSS0,PG<15:6>, PGFIVE (or $1/32^{nd}$ gain), <*4>VSS0,PG<15:5>,PGFOUR (or $1/16^{th}$ gain), <*2>VSS0,PG<15:3>,PGTWO (or $1/4^{th}$ gain), and <*3>VSS0,PG<15:4>,PGTHREE (or $1/8^{th}$ gain), respectively.

The control word value PG<15:0> is provided to an "A" input of a 16-bit adder 913, which receives the add value ADD<15:0> at its "B" input. The adder 913 adds the A and B input values together (A+B) to provide a sum value FADD<15:0> at its output. It is noted that the inverters 909 facilitate the add function since the control word bits are inverted for controlling activation of PMOS devices.

A 2-input MUX 915 (shown with notation "X16" indicating 16 parallel MUXs) has a "0" input receiving FADD<15:0>, a "1" input receiving FSUB<15:0>, and an inverted output providing the value OPB<15:0>. A 2-input AND gate 917 receives KILLB and HIGHB at its inputs and has an output provided to one input of a 2-input NOR gate 919. The other input of the NOR gate 919 receives RESUME, and its output is coupled to the select input of the MUX 915. Thus, when RESUME is logic "1," the FADD<15:0> add value is selected to increase the control word PG_CNTRL<16:0> during resume operations. When RESUME is logic "0," then the FSUB<15:0> subtract value is selected unless KILLB and HIGHB are both high. KILLB is asserted low for full power gating when PG_KILL_CORE1 is asserted high. HIGHB is asserted high when HIGH is asserted low indicating that VDD1 has reached (or dropped just below) the data retention target threshold level, so that the add value is selected to prevent further decrease of VDD1.

Figure 10:
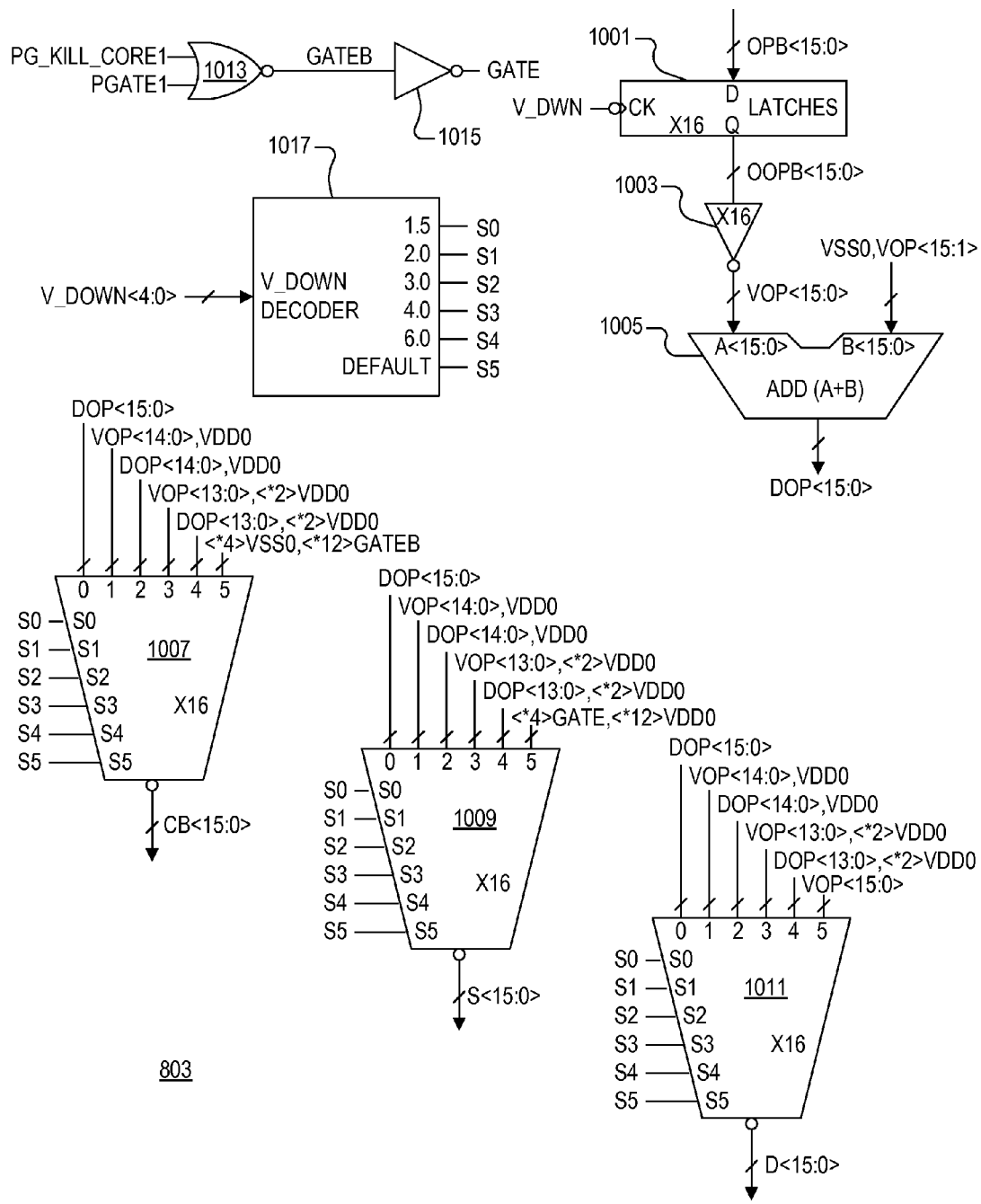
FIG. 10 is a more detailed schematic and block diagram of the global control word adjuster of FIG. 8 according to one embodiment.

FIG. 10 is a more detailed schematic and block diagram of the global control word adjuster 803 according to one embodiment. The adjusted control word value OPB<15:0> is provided to the D inputs of a set of 16 latches 1001, which asserts a latched version OOPB<15:0> at their Q outputs. The V_DWN signal is provided to an inverted clock (CK) input of the latches 1001. When V_DWN is negated low, the latches 1001 are in transparent mode and simply pass OPB<15:0> as OOPB<15:0>. When V_DWN is asserted high, the latches 1001 switch to isolation mode in which OOPB<15:0> at the output is held constant regardless of changes of OPB<15:0> at the input.

The bits of OOPB<15:0> are inverted by a set of 16 inverters 1003 providing another adjusted control word value VOP<15:0> at their outputs. The bits VOP<15:1> are provided as the lower 15 bits of a value VSS0,VOP<15:1>, which essentially is VOP<15:0> right-shifted once with VSS0 (logic "0") shifted in from the left. Thus, the value VSS0,VOP<15:1> represents ½ of the value VOP<15:0>. The values VOP<15:0> and VSS0,VOP<15:1> are provided to the A and B inputs of a 16-bit adder 1005, which has an output providing a value DOP<15:0>, which has a magnitude of 1.5 times the magnitude of the original value VOP<15:0>.

The values VOP<15:0> and DOP<15:0> are used to provide values at 1.5, 2, 3, 4 and 6 times the original value of VOP<15:0>. As noted, DOP<15:0> is 1.5 times the value of VOP<15:0>. A value VOP<14:0>,VDD0 is a value representing a one-bit left-shift of VOP<15:0> with VDD0 as logic "1" shifted in from the right and thus represents 2 times the value of VOP<15:0>. Similarly, a value DOP<14:0>,VDD0 is a value representing a one-bit left-shift of DOP<15:0> and thus represents 3 times the value of VOP<15:0>. Also, a value VOP<13:0>,<*2>VDD0 is a value representing a two-bit left-shift of VOP<15:0> with VDD0 as logic "1" shifted in twice from the right and thus represents 4 times the value of VOP<15:0>. Similarly, a value DOP<13:0>,<*2>VDD0 is a value representing 6 times the value of VOP<15:0>.

The values representing 1.5, 2, 3, 4 and 6 times the value of VOP<15:0> are provided to the inputs "0," "1," "2," "3" and "4," respectively of each of three MUXes 1007, 1009, and 1011 (each with notation "X16" denoting that each may be implemented as 16 parallel MUXes). The original value VOP<15:0> is provided to input "5" of the MUX 1011. PG_KILL_CORE1 and PGATE1 are provided to respective inputs of a 2-input NOR gate 1013, having an output providing an inverted gate signal GATEB. GATEB is provided to the input of an inverter 1015, having an output providing the GATE signal. A value <*4>VSS0,<*12>GATEB is provided to input "5" of the MUX 1007, and a value <*4>GATE, <*12>VDD0 is provided to input "5" of the MUX 1009. Each of the MUXes 1007, 1009 and 1011 have inverted outputs providing the inverted clear value CB<15:0>, the set value S<15:0>, and the data value D<15:0>, respectively, provided to the inverted clear (CB), set (S) and data (D) inputs of the register set 805 previously described.

A V_DOWN decoder 1017 receives the V_DOWN<4:0> signals and has outputs asserting one of signals S0, S1, S2, S3, S4 and 55 provided to corresponding S0, S1, S2, S3, S4 and S5 select inputs of the MUXes 1007, 1009 and 1011. The V_DOWN<4:0> signals are priority decoded such that only the highest numbered one asserted is decoded when multiple ones of the V_DOWN signals are asserted at a time. Thus, the V_DOWN decoder 1017 decodes the highest one of the V_DOWN<4:0> signals that is asserted, and asserts the corresponding signals S0-S5 for the one time adjustment of the control word. Assertion of V_DOWN<0> selects S0 for a 1.5X adjustment, assertion of V_DOWN<1> selects S1 for a 2X adjustment, assertion of V_DOWN<2> selects S2 for a 3X adjustment, assertion of V_DOWN<3> selects S3 for a 4X adjustment, and assertion of V_DOWN<4> selects S4 for a 6X adjustment of the control word. If none of the V_DOWN<4:0> signals is asserted, then the default S5 signal is asserted. Assertion of one of the signals S0-S5 causes each of the MUXes 1007, 1009 and 1011 to convey the value at its corresponding 0-5 inputs to its inverted output.

Operation of the global control word adjuster 803 is briefly described with reference to FIGS. 8 and 10. Upon power up or reset (POR) of the microprocessor 100 and/or the core 101, none of the V_DOWN<4:0> signals are asserted so that V_DWN is also not asserted. The latches 1001 are in their transparent state, PG_CLK is held low so that the register set 805 is not clocked, and the V_DOWN decoder 1017 asserts the default S5 signal to the MUXes 1007, 1009 and 1011. Since the register set 805 is not clocked, the data output D<15:0> is ignored. Instead, input "5" of both of the MUXes 1007 and 1009 are provided to the inverted clear and set inputs, respectively, of the register set 805 to force ROPB<15:0> (and thus PG<15:0>) to an initial value of 1111000000000000b. Since the same input bits are selected by each of the MUXes 1007 and 1009, the inverted clear bits from the MUX 1007 cause the register set 805 to pass the logic "0" bits, whereas the set bits from the MUX 1009 cause the register set 805 to pass the logic "1" bits.

In the illustrated embodiment, the most significant bit of PG_CNTRL, or PG16, controls a selected number of the PMOS devices, whereas the remaining PMOS devices are binarily distributed among the lower bits PG_CNTRL<15:0>. In this manner, the lower bits PG_CNTRL<15:0> are binarily weighted. In the specific embodiment, PG16 controls a significant number (e.g., most) of the PMOS devices to effectively clamp the gated supply bus 206 to the global supply bus 109, whereas the remaining PMOS devices have relatively small effect on the voltage level of VDD1 during normal operation. When PGATE1 is asserted to initiate power gating, PG16 is negated to eliminate the voltage clamping effect, whereas a suitable number of the PMOS devices remain turned on to keep the voltage level of VDD1 at substantially the same voltage level as VDD0. Although all of the lower bits PG_CNTRL<15:0> may be used for power gating, a selected subset may be used for a particular configuration.

In the illustrated configuration, PG_CNTRL<16:0> has a value of 01111000000000000b during normal operation, so that the lower bits PG_CNTRL<11:0> are low whereas the intermediate bits PG_CNTRL<15:12> are high so that only a subset of the binarily distributed PMOS devices are turned on. In this manner, after POR and during normal operation, the gated supply bus 206 is effectively clamped to the global supply bus 109 and the core 101 may operate normally. When PGATE1 is asserted to initiate power gating, PG16 is negated leaving only the PMOS devices controlled by PG_CNTRL<11:0> turned on for the initial power gating condition. Thus, a reduced number of PMOS devices remain on sufficient for power gating to reduce VDD1 to the target voltage level for state retention. In alternative configurations, the initial value of PG_CNTRL<16:0> may be adjusted to use more or less of the PMOS devices for the power gating function.

When PGATE1 is asserted for power gating and while the V_DOWN<4:0> signals remain non-asserted, the latches 1001 remain transparent and PG_CLK toggles at selected frequencies during power gating to reduce the magnitude of PG_CNTRL<16:0> and thus the voltage level of VDD1 relative to VDD0. The V_DOWN decoder 1017 asserts S5 and since PG_CLK is operating, the value VOP<15:0> at input "5" of the MUX 1011 is selected to drive the data value D<15:0> to the data input of the register set 805. In this manner, ROPB<15:0>, and thus PG<15:0> and PG_CNTRL<15:0> are all adjusted and updated with successive assertions of PG_CLK during normal power gating operation until the target voltage level is reached.

Whenever any of the V_DOWN<4:0> signals is asserted during power gating operation, V_DWN is asserted to force the latch 1001 to hold its output and PG_CLK is temporarily suspended. The V_DOWN decoder 1017 asserts a corresponding one of its outputs S0-S5, and the MUXes 1007 and 1009 each select a corresponding one of their inputs 0-4 to asynchronously update the register set 805 with the corresponding multiplied value (1.5X, 2X, 3X, 4X or 6X) of the control word, so that PG_CNTRL<16:0> is updated accordingly. As previously described, an asserted one of the V_DOWN<4:0> signals indicates a pending decrease of the voltage level of VDD0, so that the PG_CNTRL<16:0> is updated to perform a corresponding one-time increase of VDD1 to avoid an undershoot of VDD1.

FIG. 11 is a simplified schematic diagram of the control word logic 807 implemented according to one embodiment. As previously described, the control word logic 807 receives the registered control word ROPB<15:0> from the register set 805. RESUME is provided to an input of an inverter 1101, having its output coupled to one input each of a pair of 2-input NOR gates 1103 and 1105. ROPB<14> is provided to the other input of the NOR gate 1103, and ROPB<13> is provided to the other input of the NOR gate 1105. The outputs of the NOR gates 1105 and 1103 are provided to the "0" and "1" inputs of a 2-input MUX 1107, having a select input "S" receiving PG_FU_RESUME_STOP and an output providing a stop signal STP. STP is provided to a reset (R) input of a set-reset (SR) latch 1109. GATE is provided to the set (S) input of the SR latch 1109, which asserts control bit ROPB<16> at its Q output. ROPB<15:0> and ROPB<16> collectively form the value ROPB<16:0> used to develop PG_CNTRL<16:0> as further described herein.

In operation, GATE, RESUME and ROPB<16> are initially low and ROPB<13> and ROPB<14> are both initially high. Since ROPB<16> is low during normal operation, PG_CNTRL<16> (and thus MSB PG16) is low to turn on most of the PMOS devices to keep the voltage of VDD1 at the same level as VDD0. While RESUME is low, the MUX 1107 holds STP low regardless of the value of PG_FU_RESUME_STOP. When power gating (partial or full) is initiated, GATE goes high so that the SR latch 1109 de-asserts ROPB<16> high to turn off a substantial number of the PMOS devices coupled between VDD0 and VDD1. As previously noted, however, since the core 101 is already idle, the voltage of VDD1 does not drop by a significant amount. When PG_KILL_CORE1 or PGATE1 is de-asserted low to end power gating and to resume normal operations, GATE goes low and RESUME goes high. ROPB<13> and ROPB<14> are still both high, so that STP remains low.

In the default configuration, PG_FU_RESUME_STOP is low so that the MUX 1107 selects the output of the NOR gate 1105 and thus an inverted version of ROPB<13>. The magnitude of ROPB<15:0> increases until eventually ROPB<13> is asserted low so that STP is asserted high. In response, the SR latch 1109 resets and asserts ROPB<16> back low which ultimately pulls PG_CNTRL<16> low to turn on many of the PMOS devices and clamp the voltage level of VDD1 back to VDD0. If PG_FU_RESUME_STOP is instead programmed high, then the MUX 1107 instead selects the output of the NOR gate 1103 and thus an inverted version of ROPB<14>. Operation is similar except that STP is not asserted high until ROPB<14> is asserted low during a somewhat longer resume process. The stop value is thus based on a selected bit of the control word PG_CNTRL<16>, in which the selected bit represents a "minimum" stop value. In other words, once the control word changes to the point at which the selected bit changes, the resume process is effectively terminated so that normal operations may continue.

Once STP is asserted high, the SR latch 1109 pulls ROPB<16> back low to clamp the voltage level of VDD1 back to VDD0 for normal operations. RESUME goes back low, and the global control word adjuster 803 re-sets the control word to its initial value (01111000000000000b) so that ROPB<13> and ROPB<14> are pulled back high. In general, a programmed value, such as fuse or scan or the like, may be used to adjust when the resume operation is terminated based on the value of the control word to reset the control word, and thus VDD1, back to their default levels for normal operation.

In an alternative configuration for controlling ROPB<16>, PGATE1 is provided to the clock controller 706, which provides a synchronized and registered version thereof (e.g., PGATE1R, not shown). The synchronized and registered version, or PGATE1R, goes high when PGATE1 goes high, but does not go back low until PG16 goes high at the end of resume operations. In this case, PGATE1R is provided at the input of the NOR gate 1013 (instead of PGATE1) so that the function of GATE changes. Also, the output of the MUX 1107 is inverted, and the SR latch 1109 is replaced by an AND gate (not shown) receiving GATE and STP. In this alternative configuration, STP is normally high (rather than low). Since GATE is low during normal operation, ROPB<16> is low. When PGATE1 is asserted high, since STP is also high, GATE goes high and ROPB<16> is pulled high for power gating. When PGATE1 is negated low to initiate resume operations, GATE remains high (since controlled by PGATE1R rather than PGATE1) while STP is also high. When STP goes low to stop resume operations, ROPB<16> is asserted low. ROPB<16> going low eventually pulls PG16 low which pulls GATE back low to keep ROPB<16> low. PG_CNTRL<16:0> is returned to its initial value so that ROPB<13> and ROPB<14> go high, so that STP is pulled back high (recall that the output of MUX 1107 is inverted in the alternative configuration inverting the state of STP from that which is shown in FIG. 11).

PG_KILL_CORE1 is inverted by the inverter 812 to provide KILLB, which is inverted again by inverter 1111 to provide the KILL signal. KILL is also inverted by another inverter 1113 to provide another version shown as KILLBB. Each of the ROPB<6:0> signals is provided to one input of a corresponding one of a set of 7 NAND gates 1115 (denoted "X7"), each receiving KILLBB at its other input. The set of NAND gates 1115 provide the lower bits PG<6:0>. Each of the ROPB<15:7> signals is provided to one input of a corresponding one of a set of 9 NOR gates 1117 (denoted "X9"), each receiving KILL at its other input. The set of NOR gates 1117 provide the upper bits PG<15:7>. When PG_KILL_CORE1 is low, then the control value PG<15:0> is an inverted version of ROPB<15:0> and thus of PG_CNTRL<15:0>. When PG_KILL_CORE1 is high, then the low bits PG<6:0> are asserted high whereas the high bits PG<15:7> are pulled low, so that PG<15:0> is set to an "initial" value of 0000000001111111b. As further described herein, this initial value of PG<15:0> is used to set an initial value for PG_CNTRL<16:0> for the resume operation after full power gating when PG_KILL_CORE1 is next asserted back low. As shown in FIG. 8, the combined control word PG<15:0> is fed back to the incremental control word adjuster 801 and further provided to the time decoder 712. The logic gates 1115 and 1117 in response to the KILL signal (and versions thereof based on logic gates 812, 1111, 1113) and selected bits of the control word (represented by the ROPB bits) form initialization logic that initializes the value of the control word after full power gating when the resume operation is indicated by RESUME being asserted.

ROPB<15:0> and ROPB<16> collectively form a value ROPB<16:0> used to develop PG_CNTRL<16:0>. ROPB<16:0> is provided to one input of a set of 16 AND gates 1119. ROPB<16:0> is also provided through a series of inverter sets 1121 to the other input of the set of AND gates 1119, in which each inverter set includes 16 parallel inverters. The series of inverter sets 1121 show six sets coupled in series to delay the corresponding signals propagated through the inverter sets. Although each bit is delayed with 6 inverters, any number is contemplated to achieve a desired delay as further described herein. The outputs of the AND gates 1119 are provided to corresponding inputs of a set of 16 OR gates 1123, each receiving KILL at its other input. The outputs of the set of OR gates 1123 provide the control word PG_CNTRL<16:0>.

A value of "1" for a given bit of the control word PG_CNTRL turns off the corresponding set of PMOS transistors whereas a value of "0" turns the same set of PMOS transistors on. If a bit of ROPB is changed from "0" to "1", then the corresponding PMOS transistors are turned off when the corresponding bit of PG_CNTRL is changed accordingly, which tends to reduce the voltage of VDD1. Similarly, if a bit of ROPB is changed from "1" to "0", then the corresponding PMOS transistors are turned on when the corresponding bit of PG_CNTRL is changed accordingly, which tends to increase the voltage of VDD1.

A problem might exist when simultaneously changing multiple bits at a time while reducing PG_CNTRL<16:0>. In particular, multiple bit changes during the transition of PG_CNTRL from one value to another may cause PG_CNTRL to momentarily assume a lower value than intended. The momentary dip of PG_CNTRL may cause some PMOS transistors to turn off before others turn on potentially causing VDD1 to momentary dip lower than intended. The momentary dip of VDD1 might otherwise cause VDD1 to momentarily drop sufficiently below the target voltage level. Such a condition, though momentary, is problematic if VDD1 drops by a sufficient amount to cause a possible loss of state information of the core 101.

The set of inverters 1121 and the set of AND gates 1119 prevent this undesirable condition. Bits that change from "1" to "0" are quickly propagated through the set of AND gates 1119, whereas bits that change from "0" to "1" are delayed by the set of inverters 1121. In this manner, PMOS transistors that are being turned on are turned on more quickly than those PMOS transistors that are being turned off. Such operation may cause a momentary increase of the voltage level of VDD1 when the control word is being updated. A momentary increase of VDD1, however, is inconsequential and less problematic than a momentary decrease.

Figure 12:
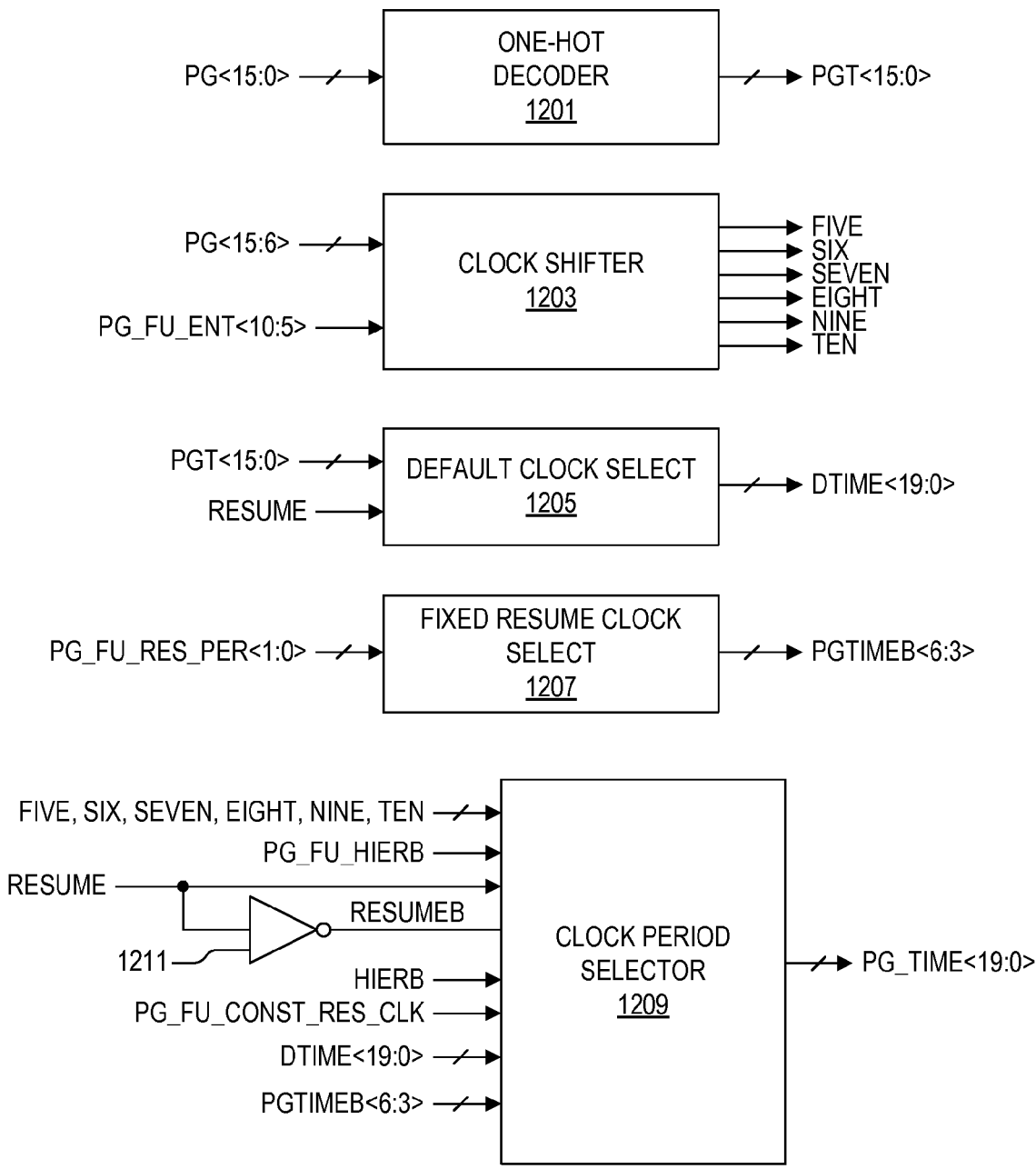
FIG. 12 is a block diagram of the time decoder of FIG. 7 implemented according to one embodiment of the present invention.

FIG. 12 is a block diagram of the time decoder 712 implemented according to one embodiment of the present invention. PG<15:0> is provided to inputs of a one-hot decoder 1201, which decodes PG<15:0> into a value PGT<15:0>. As previously described, the initial value 1111000000000000b of the preliminary control word ROPB<15:0> is inverted by logic gates 1115 and 1117, so that the initial value of PG<15:0> for power gating is 0000111111111111b. In the decoding process, only one bit of the PGT<15:0> value is asserted high at a time while the remaining bits are low, in which the high bit indicates the location of the highest-significant bit of PG<15:0> asserted high to a logic "1." Further, the numeric bits of the PGT<15:0> value are reversed in order relative to the number bits of PG<15:0>. In this manner, the initial value of PG<15:0> of 0000111111111111b causes the initial value of PGT<15:0> to be 0000000000010000b in which bit PGT<4> is high and the remaining bits are low. The PGT value may be interpreted by reading the PG value from left to right in which bit PGT<4> indicates that the fifth bit from the left of the PG value is the highest-significant bit of PG<15:0> that is asserted high. Recall that during full power gating when PG KILL_CORE1 is high, PG<15:0> becomes 0000000001111111b, which results in a PGT<15:0> value of 0000000001000000b. The PGT<15:0> value is used to develop the PG_TIME<19:0> time value to select the appropriate frequency of PG_CLK based on the mode of operation and the control word as further described herein. The one-hot decoder 1201 may be implemented with standard NOR/NAND logic or the like and is not further described.

The upper bits PG<15:6> and the PG_FU_ENT<10:5> value are provided to inputs of a clock shifter 1203, which provides corresponding values FIVE, SIX, SEVEN, EIGHT, NINE and TEN at its outputs used for shifting the time base and thus the period of the clock signal PG_CLK. The PG_FU_ENT<10:5> value may be set by fuses or the like to enable programming of further shifts of the time base of PG_CLK based on various parameters of a given configuration, such as voltage supply capacitance or the like. For example, as the control word decreases in magnitude such that certain bit positions switch to turn off corresponding PMOS devices, the PG_FU_ENT<10:5> enables a further shift of the frequency of PG_CLK by a factor of 2 to compensate for corresponding changes of the RC time constant (e.g., increasing the period of PG_CLK to slow response of adjustments). As previously described, C is the total capacitance of the core 101 and R is the collective resistance of the power gate devices (e.g., PMOS transistors 502, 504, 506, 508 and 601) coupled in parallel between VDD0 and VDD1. As the power gate devices are turned on and off, the collective resistance changes thereby changing the RC time constant.

PGT<15:0> and RESUME are provided to inputs of a default clock select circuit 1205, which outputs a default time value DTIME<19:0> for both partial power gating and resume operations. The default time value is used to provide default clock period adjustments for both partial power gating and resume operations for PG_CLK. Additional adjustments may be made to the clock period during power gating, such as for particular voltage levels of VDD1 and/or specific values of the control word PG_CNTRL. The DTIME<19:0> value may be used for resume operations to select PG_CLK unless a fixed resume clock is selected as further described herein. In addition, DTIME<19:0> may be bypassed during power gating (RESUME negated) when HIERB is asserted high as further described herein.

PG_FU_RES_PER<1:0> is a programmable 2-bit value (set by fuse or scan) that may be used to adjust a selected fixed period of PG_CLK during resume operations (when RESUME is asserted) and while exiting power gating. PG_FU_RES_PER<1:0> is provided to a fixed resume clock select circuit 1207 to develop a PGTIMEB<6:3> value. The programmable fixed resume clock period is selected when PG_FU_CONST_RES_CLK is set high by a fuse or scan or the like as further described herein bypassing the normal resume clock.

The FIVE, SIX, SEVEN, EIGHT, NINE and TEN, values, and the PG_FU_HIERB, RESUME, HIERB, PG_FU_CONST_RES_CLK, DTIME<19:0> and PGTIMEB<6:0> values are provided to corresponding inputs of a clock period selector 1209, which develops the PG_TIME<19:0> value for selecting the period of PG_CLK. RESUME is inverted by an inverter 1211 to develop a signal RESUMEB, also provided to an input of the clock period selector 1209.

Figure 13:
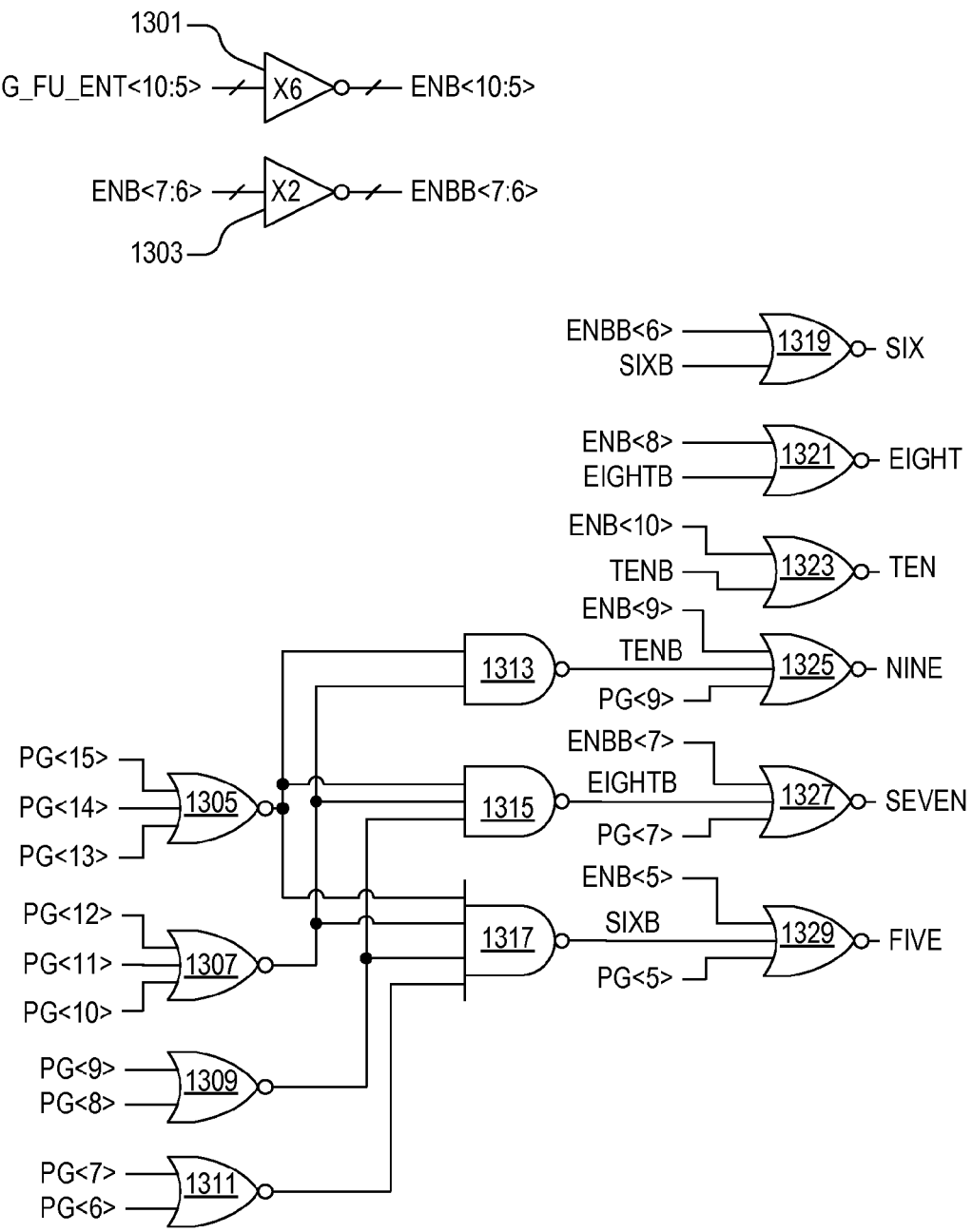
FIG. 13 is a schematic diagram of the clock shifter of FIG. 12 implemented according to one embodiment of the present invention.

FIG. 13 is a schematic diagram of the clock shifter 1203 implemented according to one embodiment of the present invention. The illustrated clock shifter 1203 includes a set of 6 inverters 1301 and another set of 2 inverters 1303, NOR gates 1305, 1307, 1309, 1311, 1319, 1321, 1323, 1325, 1327 and 1329 and NAND gates 1313, 1315 and 1317. The PG_FU_ENT<10:5> bits are each inverted by a corresponding one of the inverter set 1301 (6 inverters) to provide corresponding inverted values ENB<10:5>. The two bits 6 and 7 of are "pre-enabled" in which the ENB<7:6> bits are each inverted by a corresponding one of the inverter set 1303 (2 inverters) to provide corresponding inverted values ENBB<7:6>. The PG<15:13> bits are provided to respective inputs of NOR gate 1305 (3-input), the PG<12:10> bits are provided to respective inputs of NOR gate 1307 (3-input), the PG<9:8> bits are provided to respective inputs of NOR gate 1309 (2-input), and the PG<7:6> bits are provided to respective inputs of NOR gate 1311 (2-input).

The output of the NOR gate 1305 is provided to one input each of NAND gates 1313, 1315 and 1317. The output of the NOR gate 1307 is also provided to one input each of NAND gates 1313, 1315 and 1317. The output of the NOR gate 1309 is provided to one input each of NAND gates 1315 and 1317. The output of the NOR gate 1311 is provided to one input of the NAND gate 1317. The NAND gates 1313, 1315 and 1317 output signals TENB, EIGHTB and SIXB, respectively.

ENBB<6> and SIXB are provided to the 2 inputs of NOR gate 1319, which outputs the SIX signal. ENB<8> and EIGHTB are provided to the 2 inputs of NOR gate 1321, which outputs the EIGHT signal. ENB<10> and TENB are provided to the 2 inputs of NOR gate 1323, which outputs the TEN signal. ENB<9>, TENB and PG<9> are provided to the 3 inputs of NOR gate 1325, which outputs the NINE signal. ENB<7>, EIGHTB and PG<7> are provided to the 3 inputs of NOR gate 1327, which outputs the SEVEN signal. ENB<5>, SIXB and PG<5> are provided to the 3 inputs of NOR gate 1329, which outputs the FIVE signal.

In this manner, the PG_FU_ENT<10:5> may be used to adjust the period of PG_CLK for certain values of PG<15:6> reflective of corresponding bits of the control word PG_CNTRL<15:6>. As further described below, the FIVE-TEN values are used by the clock period selector 1209 to perform the desired clock shift (to increase the clock period) if and when asserted. The two bits PG_FU_ENT<7:6> are preset so that shifts occur when SIX and SEVEN are asserted by default, although these two preset bits may be cleared by blowing the corresponding fuses or setting via scan.

Figure 14:
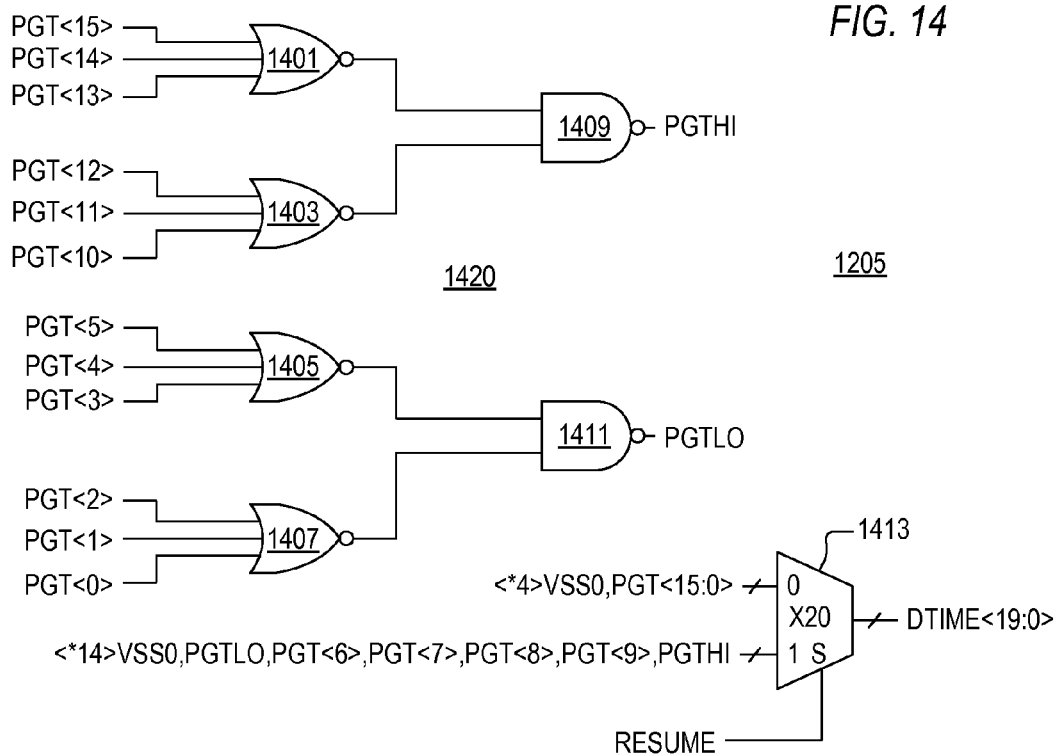
FIG. 14 is a schematic diagram of the default clock select circuit of FIG. 12 implemented according to one embodiment of the present invention.

FIG. 14 is a schematic diagram of the default clock select circuit 1205 implemented according to one embodiment of the present invention. The illustrated default clock select circuit 1205 includes a decoder 1420 and a MUX 1413 (denoted "X20" and may be implemented as 20 parallel MUXs). For the decoder 1420, the 3 upper bits PGT<15:13> of the PGT value are provided to respect inputs of a 3-input NOR gate 1401, and the next 3 upper bits PGT<12:10> are provided to respect inputs of another 3-input NOR gate 1403. Three of the lower bits PGT<5:3> of the PGT value are provided to respect inputs of another 3-input NOR gate 1405, and the lowest 3 bits PGT<2:0> are provided to respect inputs of another 3-input NOR gate 1407. The outputs of the NOR gates 1401 and 1403 are provided to the two inputs of a 2-input NAND gate 1409, and the outputs of the NOR gates 1405 and 1407 are provided to the two inputs of a 2-input NAND gate 1411. The output of the NAND gate 1409 provides a signal PGTHI and the output of the NAND gate 1411 provides a signal PGTLO.

A first value <*4>VSS0, PGT<6>,PGT<15:0> is provided to the logic "0" inputs of the MUX 1413 and a second value <*14>VSS0,PGTLO,PGT<6>,PGT<7>,PGT<8>,PGT<9>, PGHI is provided to the logic "1" inputs of the MUX 1413. RESUME is provided to the select input of the MUX 1413, providing the DTIME<19:0> value at its outputs. The first value represents 4 logic "0" bits (VSS0) appended on the left followed by the 16 PGT bits PGT<15:0> to formulate 20 bits of a first time value. The second value represents 14 logic "0" bits (VSS0) appended on the left followed by the PGTLO, PGT<6>, PGT<7>, PGT<8>, PGT<9>, PGHI to formulate 20 bits of a second time value. The first time value is selected as the DTIME<19:0> value when RESUME is low (e.g., for power gating) and the second time value is selected as the DTIME<19:0> value when RESUME is high.

Figure 15:
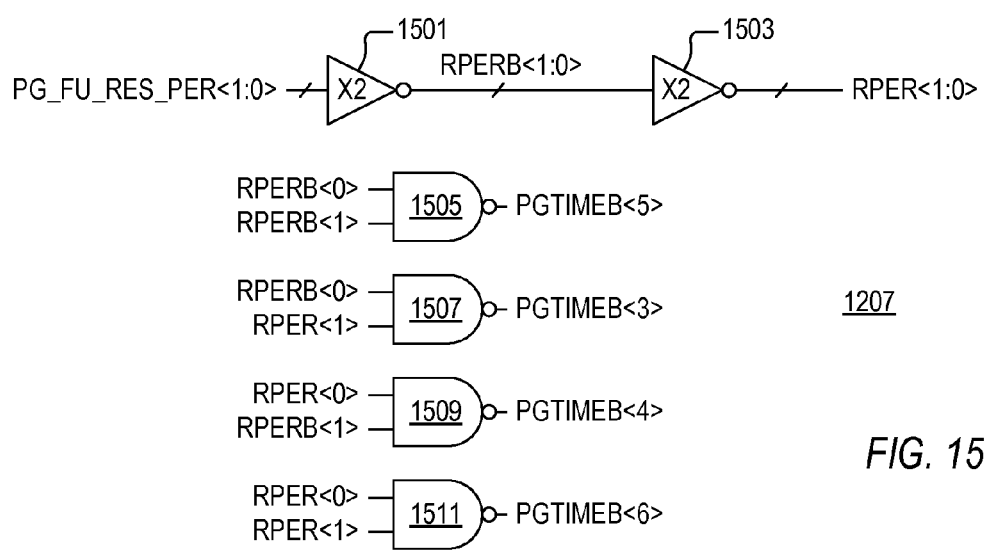
FIG. 15 is a schematic diagram of the fixed resume clock select circuit of FIG. 12 implemented according to one embodiment.

FIG. 15 is a schematic diagram of the fixed resume clock select circuit 1207 implemented according to one embodiment. The PG_FU_RES_PER<1:0> bits are provided to corresponding inputs of a pair of inverters 1501, having outputs providing corresponding inverted values RPERB<1:0>. The bits of the inverted values RPERB<1:0> are provided to corresponding inputs of another pair of inverters 1503, having outputs providing corresponding non-inverted values RPER<1:0>. RPERB<0> and RPERB<1> are provided to the inputs of a 2-input NAND gate 1505, having an output providing PGTIMEB<5>. RPERB<0> and RPER<1> are provided to the inputs of another 2-input NAND gate 1507, having an output providing PGTIMEB<3>. RPER<0> and RPERB<1> are provided to the inputs of another 2-input NAND gate 1509, having an output providing PGTIMEB<4>. RPER<0> and RPER<1> are provided to the inputs of another 2-input NAND gate 1511, having an output providing PGTIMEB<6>. The collective PGTIMEB<6:3> value is provided to the clock period selector 1209 for selecting a fixed period of PG_CLK based on PG_FU_RES_PER<1:0> when PG_FU_CONST_RES_CLK is asserted.

As shown in FIG. 15, PGTIMEB<3> is asserted for PG_FU_RES_PER<1:0>=10b, PGTIMEB<4> is asserted for PG_FU_RES_PER<1:0>=01b, PGTIMEB<5> is asserted for PG_FU_RES_PER<1:0>=00b, and PGTIMEB<6> is asserted for PG_FU_RES_PER<1:0>=11b. Thus, the fixed period of PG_CLK for the resume operation may be based on a simple decode function.

Figure 16:
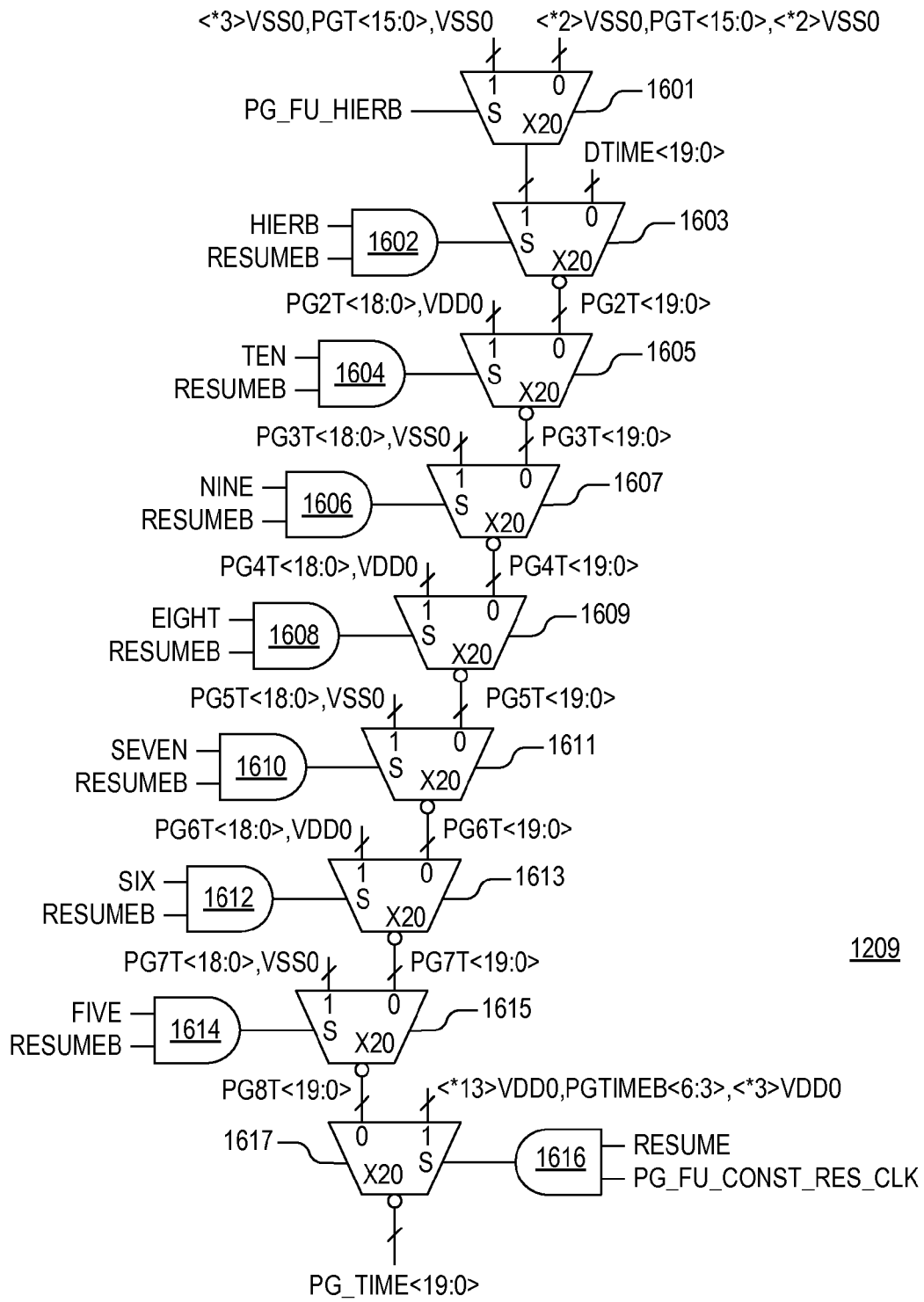
FIG. 16 is a schematic diagram of the clock period selector of FIG. 12 implemented according to one embodiment of the present invention.

FIG. 16 is a schematic diagram of the clock period selector 1209 implemented according to one embodiment of the present invention. The illustrated clock period selector 1209 includes multiple 2-input MUXes 1601, 1603, 1605, 1607, 1609, 1611, 1613, 1615, and 1617 (each denoted "X20"), in which each input includes 20 bits for selection of the 20-bit time value PG_TIME<19:0>. The output of the first MUX 1601 is not inverted, and the outputs of the remaining MUXes 1603-1617 are inverted. The illustrated clock period selector 1209 further includes multiple 2-input AND gates 1602, 1604, 1606, 1608, 1610, 1612, 1614 and 1616. PG_FU_HIERB is provided to the select input of MUX 1601. HIERB and RESUMEB are provided to inputs of the AND gate 1602, having its output coupled to the select input of the MUX 1603. TEN and RESUMEB are provided to inputs of the AND gate 1604, having its output coupled to the select input of the MUX 1605. NINE and RESUMEB are provided to inputs of the AND gate 1606, having its output coupled to the select input of the MUX 1607. EIGHT and RESUMEB are provided to inputs of the AND gate 1608, having its output coupled to the select input of the MUX 1609. SEVEN and RESUMEB are provided to inputs of the AND gate 1610, having its output coupled to the select input of the MUX 1611. SIX and RESUMEB are provided to inputs of the AND gate 1612, having its output coupled to the select input of the MUX 1613. FIVE and RESUMEB are provided to inputs of the AND gate 1614, having its output coupled to the select input of the MUX 1615. RESUME and PG_FU_CONST_RES_CLK are provided to inputs of the AND gate 1616, having its output coupled to the select input of the MUX 1617.

The logic "0" input of MUX 1601 receives a value <*2>VSS0,PGT<15:0>,<*2>VSS0, receives a value <*3>VSS0,PGT<15:0>,VSS0 at its logic "1" input, and has its output provided to the logic "1" input of the next MUX 1603. The logic "0" input of MUX 1603 receives the DTIME<19:0> value and its inverted output provides a value PG2T<19:0>. The MUX 1605 receives PG2T<19:0> at its logic "0" input, receives a value PG2T<18:0>,VDD0 at its logic "1" input, and provides a value PG3T<19:0> at its inverted output. The MUX 1607 receives PG3T<19:0> at its logic "0" input, receives a value PG3T<18:0>,VSS0 at its logic "1" input, and provides a value PG4T<19:0> at its inverted output. The MUX 1609 receives PG4T<19:0> at its logic "0" input, receives a value PG4T<18:0>,VDD0 at its logic "1" input, and provides a value PG5T<19:0> at its inverted output. The MUX 1611 receives PG5T<19:0> at its logic "0" input, receives a value PG5T<18:0>,VSS0 at its logic "1" input, and provides a value PG6T<19:0> at its inverted output. The MUX 1613 receives PG6T<19:0> at its logic "0" input, receives a value PG6T<18:0>,VDD0 at its logic "1" input, and provides a value PG7T<19:0> at its inverted output. The MUX 1615 receives PG7T<19:0> at its logic "0" input, receives a value PG7T<18:0>,VSS0 at its logic "1" input, and provides a value PG8T<19:0> at its inverted output. The MUX 1617 receives PG8T<19:0> at its logic "0" input, receives a value <*13>VDD0,PGTIMEB<6:3>,<*3>VDD0 at its logic "1" input, and provides the PG_TIME<19:0> at its inverted output.

It is noted that VSS0 or VDD0 is used to shift either a logic "0" or a logic "1" depending upon the particular MUX stage since each has an inverted output. For example, VDD0 is used to shift a logic "1" for even PGT values PG2T, PG4T, and PG6T, whereas VSS0 is used to shift a logic "0" for odd PGT values PG3T, PG5T, and PG7T in the MUX stack. It is appreciated that the values may be adjusted accordingly if the MUX outputs are not inverted.

Operation of the time decoder 712 of FIG. 7 is now briefly described. During normal operations when power gating is not applied, RESUME is low. For simplicity, it is first assumed that the bits PG_FU_ENT<10:5> are programmed such that the signals FIVE-TEN are asserted low (including SIX and SEVEN) and that the MUXes 1605-1617 each select their logic "0" input. HIERB is asserted low, so that the default value DTIME<19:0> is selected by the MUX 1603 and propagated through the MUX stack and provided as the PG_TIME<19:0> value. MUX 1413 selects the value <*4>, VSS0,PGT<15:0> as the initial or default value of PG_TIME<19:0>. As previously described, the lower bits of the control word PG_CNTRL<15:0> (other than the MSB) starts at an initial value of 111100000000000b which is inverted and provided as an initial value of PG<15:0> of 00001111111111111b, which corresponds to the initial PGT value of 0000000000010000b for the initial clock period. This initial value of PGT corresponds to an initial period of PG_CLK of about 80 ns (in which the first 3 bits are each arbitrarily defined in the illustrated configuration as a multiplier $2^0$ of the clock period). It is appreciated that this is an arbitrary clock value and that any different clock period may be selected as the initial value for different configurations.

As power gating continues, the magnitude of the control work PG_CNTRL<16:0> decreases causing a corresponding decrease of PG<15:0>. When the 11$^{th}$ bit of PG<15:0> goes to zero, PGT<15:0> changes to 0000000000100000b in which the "1" bit moves one position left. Since PGT<15:0> is incorporated within DTIME<19:0> used to adjust PG_TIME<19:0> during power gating, DTIME<19:0> and PG_TIME<19:0> are both adjusted accordingly. This increase of the PGT<15:0> value corresponds to a doubling of the period of PG_CLK since the next larger period is selected. This process continues, so that as each next significant bit of PG<15:0> goes to zero, the period of PG_CLK is doubled. As the period of PG_CLK increase, control word adjustments proceed more slowly (or otherwise occur less frequently).

As previously described, any number (zero or more) threshold voltages (e.g., PG_VREF<1:N>) may be defined for further adjusting the period of PG_CLK. As shown, one such threshold is PG_REF<1> representing threshold voltage above yet sufficiently close to the target voltage level indicated by another threshold voltage PG_VREF<2>. When the upper threshold voltage is reached during power gating, HIER goes low and HIERB goes high so that MUX 1603 switches to its logic "1" input selecting the output of the MUX 1601. If PG_FU_HIERB is low (default), then the value <*2>VSS0,PGT<15:0>,<*2>VSS0 is selected and provided to the MUX 1603 rather than DTIME<19:0>. This new value represents a double left-shift of the PGT<15:0> value within the PG_TIME<19:0> value which multiplies the period of PG_CLK by a factor of 4. This additional double shift is in addition to the normal single shift as power gating continues.

If instead PG_FU_HIERB is asserted high when HIERB goes high, then the factor <*3>VSS0,PGT<15:0>,VSS0 is selected instead by the MUX 1601 which represents an additional single left-shift which multiplies the period of PG_CLK by a factor of only 2 rather than 4. The PG_FU_HIERB value thus allows a somewhat accelerated power gating period.

Although only one threshold voltage is shown for further adjusting PG_CLK during partial power gating until the target level is reached, it is understood that any number of the threshold voltages PG_VREF<1:N> may be used for any programmable number of clock adjustments based on threshold voltages achieved in response to the corresponding compare signals CMP3-CMPN. The MUX structure shown in FIG. 16 may be modified to accommodate additional threshold voltages and corresponding clock period adjustments.

The clock shifter 1203 allows additional adjustments of the period of PG_CLK based on the value of PG<15:6> and the setting of the PG_FU_ENT<10:5> value. The value of PG_FU_ENT<10:5> allows assertion of at least one of the FIVE-TEN values, each of which causes a corresponding shift of the PG value to further adjust the period of PG_CLK. In each case, the value of PG<15:0> is shifted within the time value to multiply the period of PG_CLK by a factor of two when PG<15:0> achieves a corresponding value. For example, when TEN is asserted high during power gating while RESUMEB is also asserted high, the MUX 1605 selects PG2T<18:0>,VDD0 rather than PG2T<19:0> at the output of the MUX 1603. Thus, instead of using the all 20 bits PG2T<19:0>, this value is left shifted by shifting in a logic "1" (VDD0) forming the value PG2T<18:0>,VDD0 which multiplies the PG_CLK period by two. Operation for the remaining values NINE, EIGHT, SEVEN, SIX and FIVE operate in similar manner, in which the clock period is multiplied by two when the corresponding value is asserted. As previously described, SIX and SEVEN are pre-enabled, but may be programmatically disabled if desired. In this manner, the PG_FU_ENT<10:5> enables activation of any one or more of the values FIVE-TEN to further shift the period (and thus increase the period) of the PG_CLK for corresponding values of the control word PG_CNTRL during power gating.

As shown in FIG. 9, when HIGHB is asserted high indicating that the data or state retention level voltage has been reached, operation toggles between the add and subtract values so that the voltage VDD1 remains essentially unmodified at the retention voltage level while power gating is active. The control word PG_CNTRL experiences only minor adjustments for corresponding minor adjustments of the corresponding PG values. The period of the PG_CLK remains unmodified or may toggle between two values.

When PGATE1 is subsequently negated, RESUME is asserted so that the resume operation begins. In the case for resume operations, it is noted that the length of time from resume from full power gating is deterministic, and that the worst case (or longest amount of time) from the state retention level (for partial power gating) is also deterministic. The actual resume time depends upon the programmed values for resume operations and the specific value of the control word when resume is initiated. If PG_FU_CONST_RES_CLK is also asserted high when RESUME is asserted, then the MUX 1617 selects the value <*13>VDD0,PGTIMEB<6:3>, <*3>VDD0, in which PGTIMEB<6:3> is programmed based on the value of PG_FU_RES_PER<1:0>. The value PGTIMEB<16:3> is inserted within the time value with 13 logic "1" values padded to the left, and 3 logic "1" values to the right. As previously described and shown for FIG. 15, only one of the bits of PGTIMEB<16:3> is asserted to a logic "0" based on the value of PG_FU_RES_PER<1:0> to set a corresponding fixed period of PG_CLK. It is noted that the MUX 1617 inverts the value so that a corresponding logic "1" selects the corresponding clock period.

If instead PG_FU_CONST_RES_CLK has its default value of logic "0," then the output of the MUX stack is selected. Since RESUMEB is low, the logic "0" inputs of each of the MUXes 1603-1615 are selected so that the DTIME<19:0> value propagates through as the selected value for PG_TIME<19:0>. As shown in FIG. 14, since RESUME is high, the value <*14>VSS0,PGTLO,PGT<6>,PGT<7>, PGT<8>, PGT<9>,PGTHI is selected as the default time value DTIME during resume operations. In this case, the low bits PGT<5:0> are converted to a single bit PGTLO and the high bits PGT<15:10> are converted to a single bit PGTHI by the decoder 1420. The PGTHI and PGTLO values along with the remaining values PGT<9:6> are inserted within the time value in reverse manner. PGTLO is high only if one of the PGT<5:0> bits is asserted, and PGTHI is high only if one of the PGT<15:10> bits is asserted. As previously noted, only one of the PGT<15:0> values is asserted at a time, so that only one of the values PGTLO, PGT<6>, PGT<7>, PGT<8>, PGT<9>, and PGTHI is asserted high to select a corresponding period for PG_CLK.

Since the PGT values within the time value are reversed for resume operations, the period of PG_CLK begins at a relatively low value to enable more frequent adjustments initially. Since the add adjustment values are selected by the MUX 915 during resume, the control word starts at a relatively small value which increases during the resume operation. As the control word PG_CNTRL increases by incremental values, the period of PG_CLK incrementally increases to control the rise time of VDD1. Nonetheless, the PGTHI value consolidates the upper bits of PGT into a single bit, so that the period of PG_CLK stays short for a longer period of time (or for more iterations) to facilitate a faster initial increase of VDD1. Since the PGT values are reversed, the frequency of PG_CLK eventually slows down with increases of the control word as VDD1 approaches the operating voltage level. In an alternative configuration, the control word may be configured to start with relatively large incremental changes with correspondingly smaller adjustments of PG_CLK during resume while controlling the rise time of VDD1 at a suitable rate. Once the control word PG_CNTRL<16:0> reaches a particular level, such as the switch of bit PG_CNTRL<13> or PG_CNTRL<14> depending upon the setting of PG_FU_RESUME_STOP (selecting either ROPB<13> or ROPB<14>), the MSB bit PG16 is asserted and the control word PG_CNTRL<16:0> is asserted back to its initial value, and operation of PG_CLK is stopped.

It is appreciated that the time to increase the voltage of VDD1 from the data retention level back to the normal operating level may be faster than when decreasing to the data retention level in the opposite manner. Nonetheless, the voltage increase is controlled to ensure that VDD0 is not appreciably affected which might otherwise negatively impact supply voltage to other cores (or circuitry) of the microprocessor 100. Furthermore, the voltage increase may be programmatically modified depending upon the particular configuration.

When full power gating is activated by the assertion of PG_KILL_CORE1, KILL is asserted high by the inverter 1111 (FIG. 11) so that the set of OR gates 1123 pull each of the bits of the PG_CNTRL<16:0> control word high (so that each control word bit is negated or otherwise de-asserted). Thus, the PMOS transistors 502, 504, 506, 508 and 601 are turned off to electrically isolate VDD1 from VDD0 to pull VDD1 to ground or VSS0. PG<15:0> is initially set to the value 0000000001111111b (via logic gates 1115 and 1117), which further sets an initial value of PGT<15:0> and thus an initially selected period for PG_CLK. When PG_KILL_CORE1 is negated, RESUME is re-asserted using the initial PG and PGT values. The initial PG value sets an initial value of the PG_CNTRL<16:0> control word for resume operations. The initial PGT value sets a relatively high clock frequency of PG_CLK for faster resumption of operations if a fixed clock period is not selected for resume operations. In this manner, selection of the periods of the resume clock during resume operation is fully programmable depending upon the configuration. Although full power gating may be fully enabled very quickly, increasing the gated supply voltage back to the normal operating level may also be controlled to avoid negative impact to surrounding cores and circuitry.

It has been shown that the period of PG_CLK is programmable based on various factors to control timing of the changes of the voltage level of VDD 1 during power gating or resume operations. One factor is the value of the control word itself. As shown, for example, as the control word changes, the PGT value changes and the PG_TIME<19:0> value is shifted based on transitioning of selected PGT bits. Additional time shifts may be programmed via fuse or scan or the like. Another factor for controlling the period is the voltage level of VDD1, such as the upper threshold voltage indicated by assertion of HIER as previously described (e.g., switching inputs of the MUX 1601). Additional threshold voltages of VDD1 may be defined for additional adjustments for different implementations or configurations.

PG_CLK is developed by the clock controller 706. In the illustrated configuration, the clock controller 706 generates multiple clock signals and the time value PG_TIME<19:0> is developed by the time decoder 712 for selecting one of the clock signals. In an alternative configuration, the clock controller 706 may be implemented as a programmable clock generator in which the time value is used to program the period of the clock signal. In other alternative configurations, the clock controller 706 may be implemented using timers or counters or the like.

It has also been shown that the control word adjustments are programmable based on various factors to control timing of the changes of the voltage level of VDD1 during power gating or resume operations. One factor is the control word itself which is shifted by a selectable amount to control adjustment gain.

Figure 17:
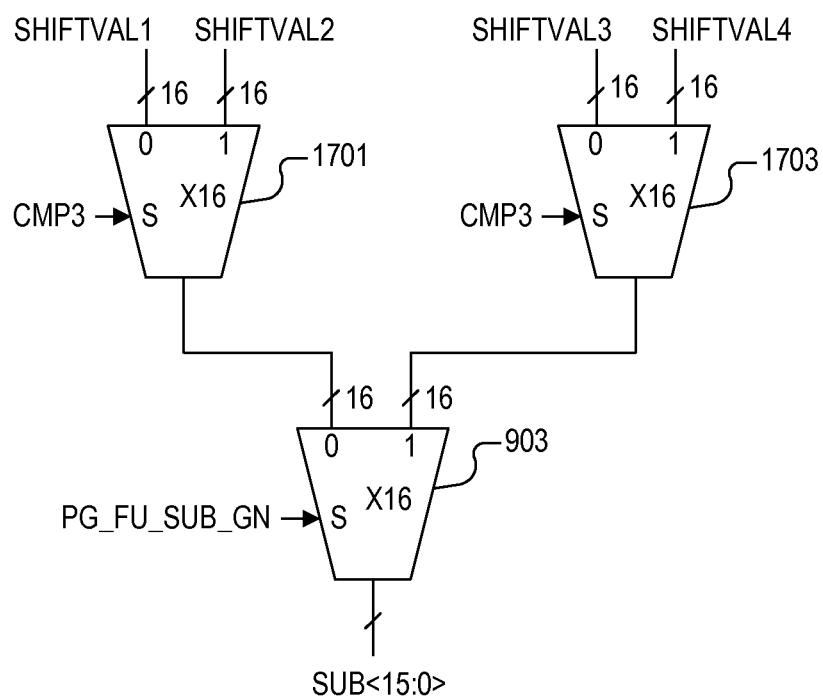
FIG. 17 is a schematic diagram of an alternative embodiment in which additional adjustment of gain is made based on a threshold voltage as indicated by a compare signal indicative of crossing a predetermined threshold voltage.

The illustrated embodiment so far has shown adjustments of PG_CLK based on the programmable threshold voltages. Adjustment of gain based on the programmable threshold voltages may also be used. As shown in FIG. 17, for example, additional adjustment of the gain is made based on a threshold voltage as indicated by the compare signal CMP3. As shown in FIG. 17, the inputs to the MUX 903 are modified to be the outputs of additional MUXes 1701 and 1703. In a similar manner as previously noted, the MUX 903 and the MUXes 1701 and 1703 are X16 for a 16-bit configuration. The MUX 903 selects between MUX 1701 and 1703 based on the programmed value of PG_FU_SUB_GN. The MUX 1701 selects between shift values SHIFTVAL1 and SHIFTVAL2 based on CMP3 and the MUX 1703 selects instead between shift values SHIFTVAL3 and SHIFTVAL4 based on CMP3. Each SHIFTVAL value is 16 bits and represents a different shifted version of the control word to correspond with a different gain value during power gating. Additional MUXes may be stacked in this manner for either or both of the add and subtract values to facilitate gain adjustment based on any number of threshold voltages.

A system and method for digital power gating with data retention as described herein is fully programmable to digitally control a gated voltage, such as a local supply voltage, based on activating or deactivating selected numbers of current devices, such as PMOS or NMOS transistors or the like coupled between the first voltage and a second voltage, such as a global supply voltage. A microprocessor may have many levels of power gating so that the particular target voltage may be adjusted statically or dynamically. Also, the particular configuration of the circuit or core or the like may be varied, such as incorporating ECC memory or the like. Thus, the reference voltage determining the target level may be adjusted or a different reference voltage selected. Actual target voltage levels may be determined empirically for given configurations and operating modes. The system and method for digital power gating with data retention as described herein is fully programmable to any suitable voltage level.

The binary value of the control word PG_CNTRL may depend on many factors, such as processor, temperature and the target voltage level. The actual voltage is measured and is continuously or periodically adjusted by adding or subtracting an adjustment value in a control loop. The system and method for digital power gating with data retention as described herein operates in a similar manner as an analog voltage regulator, except that it is digitally controlled and applied to an area solution comprising binarily distributed devices which are activated or deactivated based on the monitored target voltage level.

Although the present invention has been described in considerable detail with reference to certain preferred versions thereof, other versions and variations are possible and contemplated. The circuits and logic functions described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention.

What is claimed is:

1. A digital power gating system for controlling a voltage of a gated supply bus coupled to a supply voltage input of a functional circuit relative to a voltage of a global supply bus, said digital power gating system comprising:
    a plurality of gating devices, each said gating device having a pair of current terminals for coupling between the global supply bus and the gated supply bus and each having a control terminal;
    a power gating control system that controls a digital control value, wherein said digital control value comprises a plurality of bits in which each bit of said digital control value is provided to control at least one control terminal of said plurality of gating devices to control activation of a corresponding subset of said plurality of gating devices; and
    wherein said power gating control system is configured to perform power gating by successively adjusting said digital control value to reduce a voltage of the gated supply bus to a state retention voltage level that reduces leakage current while retaining a digital state of the functional circuit.

2. The digital power gating system of claim 1, wherein a at least two of said plurality of bits of said digital control value are binarily weighted.

3. The digital power gating system of claim 1, wherein a power controller places the functional circuit in an idle mode, turns off a functional clock provided to the functional circuit, and asserts a gating control signal that causes said power gating control system to reduce said voltage of the gated supply bus to said state retention voltage level which is indicated by a reference voltage.

4. The digital power gating system of claim 1, wherein said power gating control system comprises a digital adjuster that reduces said voltage of the gated supply bus by combining a digital adjustment value with said digital control value after each of a plurality of sequential adjustment periods.

5. The digital power gating system of claim 4, wherein said digital adjuster periodically adjusts said digital adjustment value to maintain a constant gain during successive adjustments.

6. The digital power gating system of claim 4, wherein said digital adjustment value is a shifted version of a current value of said digital control value.

7. The digital power gating system of claim 4, wherein said digital adjuster periodically adjusts a rate of adjustment and a magnitude of said digital adjustment value to avoid undershooting said state retention voltage level.

8. The digital power gating system of claim 4, wherein said digital adjuster increases a duration of said plurality of sequential adjustment periods and reduces said digital adjustment value as said voltage of the gated supply bus decreases towards said state retention voltage level.

9. The digital power gating system of claim 1, further comprising:
a voltage comparator that compares said voltage of the gated supply bus with a plurality of threshold voltages including a predetermined threshold voltage indicative of said state retention voltage level; and
wherein said power gating control system comprises a clock controller that modifies a period of a clock signal that controls adjustment timing when said voltage of the gated supply bus reaches each of at least one predetermined voltage level that is greater than said state retention voltage level.

10. The digital power gating system of claim 1, wherein said power gating control system comprises a clock controller that modifies a period of a clock signal that controls adjustment timing when said digital control value becomes equal to each of at least one predetermined value.

11. The digital power gating system of claim 1, wherein said power gating control system comprises an incremental adjuster that selects from among a plurality of different shifted versions of said digital control value to provide a digital adjustment value that is combined with said digital control value to adjust said digital control value, and wherein said incremental adjuster selects a different one of said plurality of different shifted versions of said digital control value as said digital adjustment value when said digital control value reaches each of at least one predetermined value.

12. The digital power gating system of claim 1, further comprising:
a voltage comparator that compares said voltage of the gated supply bus with a plurality of threshold voltages including a predetermined threshold voltage indicative of said state retention voltage level; and
wherein said power gating control system comprises an incremental adjuster that selects from among a plurality of different shifted versions of said digital control value to provide a digital adjustment value that is combined with said digital control value to adjust said digital control value, and wherein said incremental adjuster selects a different one of said plurality of different shifted versions of said digital control value as said digital adjustment value when said voltage of the gated supply bus reaches each of at least one predetermined voltage level that is greater than said state retention voltage level.

13. The digital power gating system of claim 1, wherein said power gating control system periodically adjusts at least one of an adjustment rate and a magnitude of adjustment of said digital control value so that said voltage of the gated supply bus follows a predetermined voltage curve.

14. An integrated circuit, comprising:
a global supply bus and at least one gated supply bus;
at least one functional block, each having a voltage supply input coupled to a corresponding one of said at least one gated supply bus; and
at least one digital power gating system, each provided for a corresponding one of said at least one functional block, each comprising:
a plurality of gating devices, each having a pair of current terminals coupled between said global supply bus and said corresponding gated supply bus and each having a control terminal;
a power gating control system that controls a digital control value, wherein said digital control value comprises a plurality of bits in which each bit of said digital control value is provided to control at least one control terminal of said plurality of gating devices to control activation of a corresponding subset of said plurality of gating devices; and
wherein said power gating control system performs power gating by successively adjusting said digital control value to reduce a voltage of said corresponding gated supply bus to a state retention voltage level that reduces leakage current while retaining a digital state of a corresponding one of said at least one functional block.

15. The integrated circuit of claim 14, wherein each of said plurality of gating devices comprises a PMOS transistor.

16. The integrated circuit of claim 14, wherein a first bit of said digital control value controls a subset of said plurality of gating devices, and wherein a remainder of said plurality of gating devices are binarily distributed among remaining bits of said digital control value.

17. The integrated circuit of claim 14, further comprising a power controller that places said corresponding functional block in an idle mode, that turns off a clock signal provided to said functional block, and that asserts a gating control signal to cause said power gating control system to reduce said voltage of said corresponding gated supply bus to said state retention voltage level.

18. The integrated circuit of claim 14, further comprising a limit circuit that limits said digital control value to a predetermined minimum digital value.

19. The integrated circuit of claim 14, further comprising:
said at least one functional block comprising a plurality of functional blocks;
said at least one gated supply bus comprising a plurality of gated supply buses, each providing a gated supply voltage to a corresponding one of said plurality of functional blocks;

said at least one digital power gating system comprising a plurality of digital power gating system, each for performing power gating for a corresponding one of said plurality of functional blocks; and
a power controller that initiates power gating for any of said plurality of functional blocks by asserting corresponding ones of a plurality of gating control signals.

20. The integrated circuit of claim 19, wherein said plurality of functional blocks comprises a plurality of processor cores of a multiple processor system.

21. The integrated circuit of claim 14, wherein said power gating control system comprises:
a clock controller that provides a clock signal having a period that controls an adjustment rate of successive adjustments of said digital control value, and that adjusts said period of said clock signal when said voltage of said corresponding gated supply bus reaches each of at least one of a plurality of threshold voltages; and
a power gating controller that receives a power gating control signal and said clock signal, and that develops and adjusts said digital control value to perform said power gating.

22. The integrated circuit of claim 14, wherein said power gating control system comprises:
a clock controller that provides a clock signal having a period that controls an adjustment rate of successive adjustments of said digital control value, and that adjusts said period of said clock signal when said digital control value reaches each of at least one predetermined value of said digital control value during power gating; and
a power gating controller that receives a power gating control signal and said clock signal, and that develops and adjusts said digital control value to perform said power gating.

23. The integrated circuit of claim 14, wherein said power gating control system comprises:
a clock controller that provides a clock signal having a period that controls an adjustment rate of successive adjustments of said digital control value, and that adjusts said period of said clock signal when said digital control value reaches each of a plurality of programmed values during power gating; and
a power gating controller that receives a power gating control signal and said clock signal, and that develops and adjusts said digital control value to perform said power gating.

24. The integrated circuit of claim 14, wherein said power gating control system comprises:
a clock controller that provides a clock signal having a period that controls an adjustment rate of successive adjustments of said digital control value, wherein said clock controller comprises:
a decoder that converts said digital control value to a time control value; and
select logic that uses said time control value to determine said period of said clock signal during said power gating; and
a power gating controller that receives a power gating control signal and said clock signal, and that develops and adjusts said digital control value to perform said power gating.

25. The integrated circuit of claim 24, wherein said decoder comprises a one-hot decoder that adjusts said time control value to indicate a highest bit of said digital control value that is asserted to an off state, and wherein said period of said clock signal is increased with each change of said time control value during said power gating.

26. The integrated circuit of claim 25, wherein said select logic selects a digitally shifted version of said time control value when said voltage of said corresponding gated supply bus has decreased to an upper threshold voltage that is greater than said state retention voltage level.

27. The integrated circuit of claim 24, wherein said clock controller further comprises:
a clock shifter that converts a subset of bits of said digital control value into a plurality of period adjust values; and
a clock period selector that adjusts said period of said clock signal when any of said plurality of period adjust values becomes true as said digital control value is adjusted during said power gating.

28. The integrated circuit of claim 14, wherein said power gating control system comprises:
a clock controller that provides a clock signal having a period that controls an adjustment rate of successive adjustments of said digital control value; and
a power gating controller that receives a power gating control signal and said clock signal, and that develops and adjusts said digital control value to perform said power gating, wherein said power gating controller comprises:
a digital subtractor that subtracts a digital adjustment value from said digital control value synchronous with said clock signal to adjust said digital control value over time during power gating; and
wherein said digital adjustment value is a shifted version of said digital control value.

29. The integrated circuit of claim 14, wherein said power gating control system comprises:
a clock controller that provides a clock signal having a period that controls an adjustment rate of successive adjustments of said digital control value; and
a power gating controller that receives a power gating control signal and said clock signal, and that develops and adjusts said digital control value to perform said power gating, wherein said power gating controller comprises:
a digital subtractor that subtracts a digital adjustment value from said digital control value synchronous with said clock signal to adjust said digital control value over time during power gating;
select logic that selects from among a plurality of different shifted versions of said digital adjustment value; and
gain logic that causes said select logic to select a different one of said plurality of different shifted versions of said digital adjustment value when said digital control value is equal to each of at least one predetermined value.

30. The integrated circuit of claim 14, wherein said power gating control system comprises:
a clock controller that provides a clock signal having a period that controls an adjustment rate of successive adjustments of said digital control value; and
a power gating controller that receives a power gating control signal and said clock signal, and that develops and adjusts said digital control value to perform said power gating, wherein said power gating controller comprises:
a digital subtractor that subtracts a digital adjustment value from said digital control value synchronous with said clock signal to adjust said digital control value over time during power gating;

select logic that selects from among a plurality of different shifted versions of said digital adjustment value; and gain logic that causes said select logic to select a different one of said plurality of different shifted versions of said digital adjustment value when said voltage of said corresponding gated supply bus reaches each of at least one of a plurality of threshold voltages.

31. The integrated circuit of claim 14, wherein said power gating control system comprises:

a clock controller that provides a clock signal having a period that controls an adjustment rate of successive adjustments of said digital control value; and a power gating controller that receives a power gating control signal and said clock signal, and that develops and adjusts said digital control value to perform said power gating, wherein said power gating controller comprises:

a digital subtractor that subtracts a digital subtract value from said digital control value to provide a reduced digital value;

a digital adder that adds a digital add value to said digital control value to provide an increased digital value;

select logic that selects between said reduced digital value and said increased digital value to provide a selected digital value;

register logic receiving said selected digital value to provide an updated digital control value synchronous with said clock signal; and wherein said digital subtract value and said digital add value both comprise shifted versions of said digital control value.

32. The integrated circuit of claim 14, wherein said power gating control system comprises:

a clock controller that provides a clock signal having a period that controls an adjustment rate of successive adjustments of said digital control value; and a power gating controller that receives a power gating control signal and said clock signal, and that develops and adjusts said digital control value to perform said power gating wherein said power gating controller comprises:

a digital subtractor that subtracts a digital subtract value from said digital control value to provide a reduced digital value;

a digital adder that adds a digital add value to said digital control value to provide an increased digital value;

select logic that selects between said reduced digital value and said increased digital value to provide a selected digital value;

register logic receiving said selected digital value to provide an updated digital control value synchronous with said clock signal; and a gain selector that selects between a plurality of different digital subtract values each comprising a shifted version of said digital control value.

33. A method of power gating a supply voltage provided to a functional block, comprising:

providing a digital control value that controls activation of each of a plurality of current devices coupled between a non-gated supply bus and a gated supply bus;

asserting the digital control value to activate a sufficient number of the current devices to clamp the voltage of the gated supply bus to the non-gated supply bus during a full power mode; and in response to receiving a gate control signal, performing power gating by periodically adjusting a magnitude of the digital control value until the voltage of the gated supply bus reaches a state retention voltage level that reduces leakage current while retaining a digital state of the functional block.

34. The method of claim 33, further comprising binarily weighting a subset of bits of the digital control value.

35. The method of claim 33, wherein said periodically adjusting a magnitude of the digital control value comprises periodically combining the digital control value with a digital adjustment value.

36. The method of claim 35, further comprising providing the digital adjustment value as a shifted version of the digital control value.

37. The method of claim 35, further comprising:

comparing a voltage of the gated supply bus with at least one threshold voltage;

selecting one of a plurality of shifted versions of the digital control value as a first digital adjustment value; and selecting a different one of the plurality of shifted versions of the digital control value when the voltage of the gated supply bus reaches each of the at least one threshold voltage.

38. The method of claim 35, further comprising:

selecting one of a plurality of shifted versions of the digital control value as a first digital adjustment value; and selecting a different one of the plurality of shifted versions of the digital control value when the digital control value reaches each of at least one predetermined value.

39. The method of claim 35, further comprising providing a clock signal and wherein said periodically combining comprises periodically combining at a rate based on a period of the clock signal.

40. The method of claim 39, further comprising:

comparing a voltage of the gated supply bus with at least one threshold voltage; and wherein said providing a clock signal comprises:

providing the clock signal at an initial period; and changing the period of the clock signal when the voltage of the gated supply bus reaches each of the at least one threshold voltage.

41. The method of claim 39, wherein said providing a clock signal comprises:

providing the clock signal at an initial period; and changing the period of the clock signal when the digital control value reaches each of at least one predetermined value.

42. The method of claim 39, further comprising:

converting a subset of bits of the digital control value to a plurality of period adjust values; and changing the period of the clock signal when any of the plurality of period adjust values becomes true.

43. A computer program product encoded in at least one non-transitory computer usable medium for use with a computing device, the computer program product comprising:

computer usable program code embodied in said medium for specifying a digital power gating system for controlling a voltage of a gated supply bus coupled to a supply voltage input of a functional circuit relative to a voltage of a global supply bus, the computer usable program code comprising:

first program code for specifying a plurality of gating devices, each said gating device having a pair of current terminals for coupling between the global supply bus and the gated supply bus and each having a control terminal;

second program code for specifying a power gating control system that controls a digital control value, wherein said digital control value comprises a plurality of bits in which each bit of said digital control value is provided to control at least one control terminal of said plurality of gating devices to control activation of a corresponding subset of said plurality of gating devices; and wherein said power gating control system is configured to perform power gating by successively adjusting said digital control value to reduce a voltage of the gated supply bus to a state retention voltage level that reduces leakage current while retaining a digital state of the functional circuit.

* * * * *